(12) United States Patent
Lee et al.

(10) Patent No.: US 11,995,265 B2
(45) Date of Patent: May 28, 2024

(54) DISPLAY DEVICE HAVING A SENSING CONTROLLER FOR CONTROLLING THE DRIVING OF AN INPUT SENSING LAYER

(71) Applicant: Samsung Display Co., Ltd., Yongin-si (KR)

(72) Inventors: Jiyeong Lee, Seoul (KR); Hyun-Wook Cho, Yongin-si (KR); Sangkook Kim, Cheonan-si (KR); Taejoon Kim, Seongnam-si (KR); Hyungbae Kim, Hwaseong-si (KR); Jaehyun Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/955,794

(22) Filed: Sep. 29, 2022

(65) Prior Publication Data

US 2023/0185402 A1 Jun. 15, 2023

(30) Foreign Application Priority Data

Dec. 10, 2021 (KR) .......................... 10-2021-0176610

(51) Int. Cl.
*G06F 3/041* (2006.01)
*G06F 3/044* (2006.01)
*H10K 59/12* (2023.01)

(52) U.S. Cl.
CPC ........ *G06F 3/04166* (2019.05); *G06F 3/0412* (2013.01); *G06F 3/0446* (2019.05); *H10K 59/12* (2023.02)

(58) Field of Classification Search
CPC .. G06F 3/04166; G06F 3/0446; G06F 3/0412; H10K 59/12
See application file for complete search history.

(56) References Cited

U.S. PATENT DOCUMENTS

| 9,563,294 | B2 | 2/2017 | Lee |
| 11,157,116 | B2 | 10/2021 | Kim et al. |
| 2012/0113339 | A1* | 5/2012 | Park ...................... G06F 3/0445 349/33 |
| 2020/0326815 | A1* | 10/2020 | Choi ..................... G06F 3/0446 |
| 2021/0326024 | A1 | 10/2021 | Jun et al. |

FOREIGN PATENT DOCUMENTS

| KR | 10-2013-0053060 | 5/2013 |
| KR | 10-1898979 | 9/2018 |
| KR | 10-2159067 | 9/2020 |
| KR | 10-2020-0140434 | 12/2020 |

* cited by examiner

*Primary Examiner* — Lisa S Landis
(74) *Attorney, Agent, or Firm* — KILE PARK REED & HOUTTEMAN PLLC

(57) ABSTRACT

A display device includes a display panel that displays an image, an input sensor that senses an external input, and a sensing controller that controls the driving of the input sensor. The input sensor includes a plurality of scanning electrodes and a plurality of sensing electrodes. The sensing controller simultaneously transmits input scanning signals to at least two scanning electrodes of the plurality of scanning electrodes during a group scanning period. The group scanning period includes a plurality of scanning periods. The sensing controller transmits a compensating signal having a phase different from a phase of at least one of the input scanning signals to at least one sensing electrode of the plurality of sensing electrodes during at least one scanning period of the plurality of scanning periods.

23 Claims, 17 Drawing Sheets

DISPLAY DEVICE HAVING A SENSING CONTROLLER FOR CONTROLLING THE DRIVING OF AN INPUT SENSING LAYER

CROSS-REFERENCE TO RELATED APPLICATION(S)

This application claims priority to and benefits of Korean Patent Application No. 10-2021-0176610 under 35 U.S.C. § 119, filed on Dec. 10, 2021, in the Korean Intellectual Property Office (KIPO), the entire contents of which are incorporated herein by reference.

BACKGROUND

1. Technical Field

Embodiments of the disclosure relate to a display device, and more particularly, relate to a display device capable of displaying an image and detecting an external input.

2. Description of the Related Art

Multimedia electronic devices, such as a television (TV), a cellular phone, a tablet computer, a navigation system, or a game console, include a display device which displays an image. An electronic device may include an input sensor that operates in a touch-based input manner for enabling a user to intuitively, conveniently, and easily input information or a command, in addition to a general input manner, such as a button, a keyboard, or a mouse, The input sensor may be included in the display device to sense a touch information of a physical body of a user.

SUMMARY

Embodiments of the disclosure provide a display device capable of maintaining reliability and quality of an image displayed on a display panel by preventing or minimizing the influence or interference caused by operation of an input sensor for sensing an external input.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display device may include a display panel that displays an image, an input sensor disposed on the display panel, the input sensor that senses an external input, and a controller to control the driving of the input sensor. The input sensor may include a plurality of scanning electrodes and a plurality of sensing electrodes electrically insulated from the plurality of scanning electrodes. The controller simultaneously may transmit input scanning signals to at least two scanning electrodes of the plurality of scanning electrodes, during a group scanning period. The group scanning period may include a plurality of scanning periods. The controller may transmit a compensating signal having a phase different from a phase of at least one of input scanning signals to at least one sensing electrode of the plurality of sensing electrodes during at least one scanning period of the plurality of scanning periods.

According to an embodiment, the at least one of the input scanning signals may include: a first phase scanning signal having a first phase, and a second phase scanning signal having a second phase reverse to the first phase. The at least two scanning electrodes may include 'k' number of first phase scanning electrodes receiving the first phase scanning signal during the at least one scanning period. The at least two scanning electrodes may include T number of second phase scanning electrodes receiving the second phase scanning signal during the at least one scanning period. The 'k' and the 'j' may be natural numbers equal to or greater than 1, and may be different numbers from each other.

According to an embodiment, when the 'k' is greater than the 'j', the compensating signal may have the second phase during the at least one scanning period.

According to an embodiment, when the value of the compensating signal is 1/h times of the value of the first phase scanning signal, the compensating signal may be applied to 'm' number of sensing electrodes of the plurality of sensing electrodes. The 'm' may satisfy following Equation 1, $$i = h \times (k-j) \qquad \text{Equation 1}$$

According to an embodiment, when the 'k' is less than the 'j', the compensating signal may have the first phase during the at least one scanning period.

According to an embodiment, when the value of the compensating signal is 1/h times of the value of the first phase scanning signal, the compensating signal may be applied to 'm' number of sensing electrodes of the plurality of sensing electrodes. The 'm' may satisfy following Equation 2.

$$i = h \times (j-k) \qquad \text{Equation 2}$$

According to an embodiment, the controller may simultaneously transmit the input scanning signals to a first scanning electrode and a second scanning electrode during the group scanning period. The plurality of scanning durations may include a first scanning period and a second scanning period. The first scanning electrode and the second scanning electrode may receive a first phase scanning signal having a first phase, during the first scanning period. The first scanning electrode may receive the first phase scanning signal, and the second scanning electrode may receive a second phase scanning signal having a second phase, during the second scanning period. The first phase is reverse to the second phase.

According to an embodiment, the controller may transmit the compensating signal to the at least one sensing electrode during the first scanning period.

According to an embodiment, the compensating signal may have the second phase, during the first scanning period.

According to an embodiment, the controller may transmit the compensating signal to the plurality of sensing electrodes during the second scanning period.

According to an embodiment, the controller may transmit a sensing signal of the input scanning signals to remaining sensing electrodes of the plurality of sensing electrodes except for the at least one sensing electrode receiving the compensating signal.

According to an embodiment, the controller may transmit the compensating signal to the at least one sensing electrode of the plurality of sensing electrodes. The controller may apply a ground voltage to sensing electrodes adjacent to the at least one sensing electrode of the plurality of sensing electrodes. The controller may transmit the sensing signal to remaining sensing electrodes of the plurality of sensing electrodes except for the at least one sensing electrodes and the sensing electrodes adjacent to the at least one sensing electrode.

According to an embodiment, the controller may transmit the compensating signal to the at least one sensing electrode of the plurality of sensing electrodes. The controller maintains, in the floating state, sensing electrodes adjacent to the at least one sensing electrode of the plurality of sensing electrodes. The controller may transmit the sensing signal to remaining sensing electrodes of the plurality of sensing electrodes except for the at least one sensing electrodes and the sensing electrodes adjacent to the at least one sensing electrode.

According to an embodiment, the controller may sense the external input during a first sensing frame and a second sensing frame. The controller may transmit the compensating signal to the first sensing electrodes of the plurality of sensing electrodes during the first sensing frame, and transmit the compensating signal to a second sensing electrode of the plurality of sensing electrodes, during the second sensing frame.

According to an embodiment, the display panel may further include a display element layer including a light emitting element, and an encapsulating layer disposed on the display element layer According to an embodiment, the input sensor may be directly disposed on the encapsulating layer.

According to an embodiment, the display device may further include an adhesive film disposed on the display panel and the input sensor.

According to an embodiment, a display device includes a display panel that displays an image, an input sensor disposed on the display panel to sense an external input, and a controller to control the driving of the input sensor. The input sensor may include a plurality of scanning electrodes and a plurality of sensing electrodes electrically insulated from the plurality of scanning electrodes. The controller may transmit input scanning signals to the plurality of scanning electrodes to sense the external input. The controller may transmit a compensating signal having a phase different from each of phases of the input scanning signals, to at least one sensing electrode of the plurality of sensing electrodes.

According to an embodiment, the phase of the compensating signal may be reverse to each of the phases of the input scanning signals, and the input sensor may detect the external input during a first sensing frame and a second sensing frame. The controller may transmit the compensating signal to a first sensing electrode of the plurality of sensing electrodes, during the first sensing frame. The controller may transmit the compensating signal to a second sensing electrode of the plurality of sensing electrodes, during the second sensing frame.

According to an embodiment, the controller may transmit a sensing signal to remaining sensing electrodes of the plurality of sensing electrodes except for the at least one sensing electrode receiving the compensating signal.

According to an embodiment, the plurality of scanning electrodes may include 'x' number of first electrodes. The plurality of sensing electrodes may include 'y' number of second electrodes. The 'x' and the 'y' may be natural numbers equal to or greater than 1, and may be an equal number or different numbers from each other.

According to an embodiment, the controller may sequentially transmit the input scanning signals to the 'x' number of scanning electrodes.

BRIEF DESCRIPTION OF THE DRAWINGS

The above and other objects and features of the disclosure will become apparent by describing in detail embodiments thereof with reference to the accompanying drawings.

DETAILED DESCRIPTION OF THE EMBODIMENTS

Figure 1:
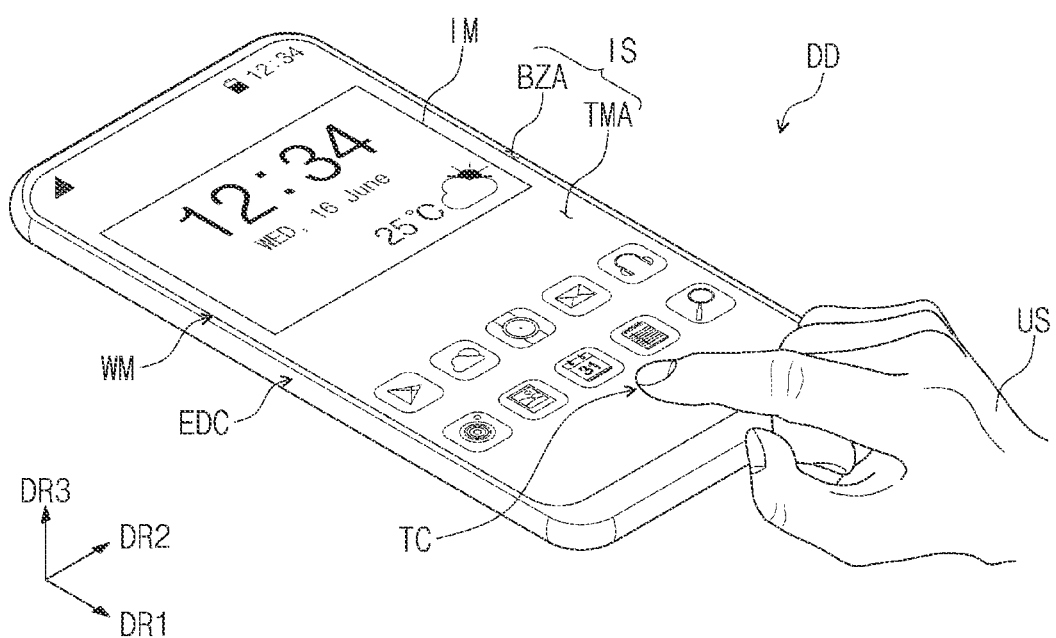
FIG. 1 is a schematic perspective view illustrating a display device, according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

The expression that a first component (or area, layer, part, portion, etc.) is "on", "connected with", or "coupled to" a second component means that the first component is directly on, connected with, or coupled to the second component or means that a third component is disposed therebetween.

The same reference numeral refers to the same component. In drawings, thicknesses, proportions, and dimensions of components may be exaggerated to describe the technical features effectively. The expression "and/or" includes one or more combinations which associated components are capable of defining.

Although the terms "first", "second", etc. may be used to describe various components, the components should not be construed as being limited by the terms. The terms are only used to distinguish one component from another component. For example, without departing from the scope and spirit of the invention, a first component may be referred to as a second component, and similarly, the second component may be referred to as the first component. The singular forms are intended to include the plural forms unless the context clearly indicates otherwise.

Also, the terms "under", "below", "on", "above", etc. are used to describe the correlation of components illustrated in drawings. The terms that are relative in concept are described based on a direction shown in drawings.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Unless otherwise defined, all terms (including technical terms and scientific terms) used in the specification have the same meaning as commonly understood by one skilled in the art to which the disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Hereinafter, embodiments of the disclosure will be described with reference to accompanying drawings.

Figure 2:
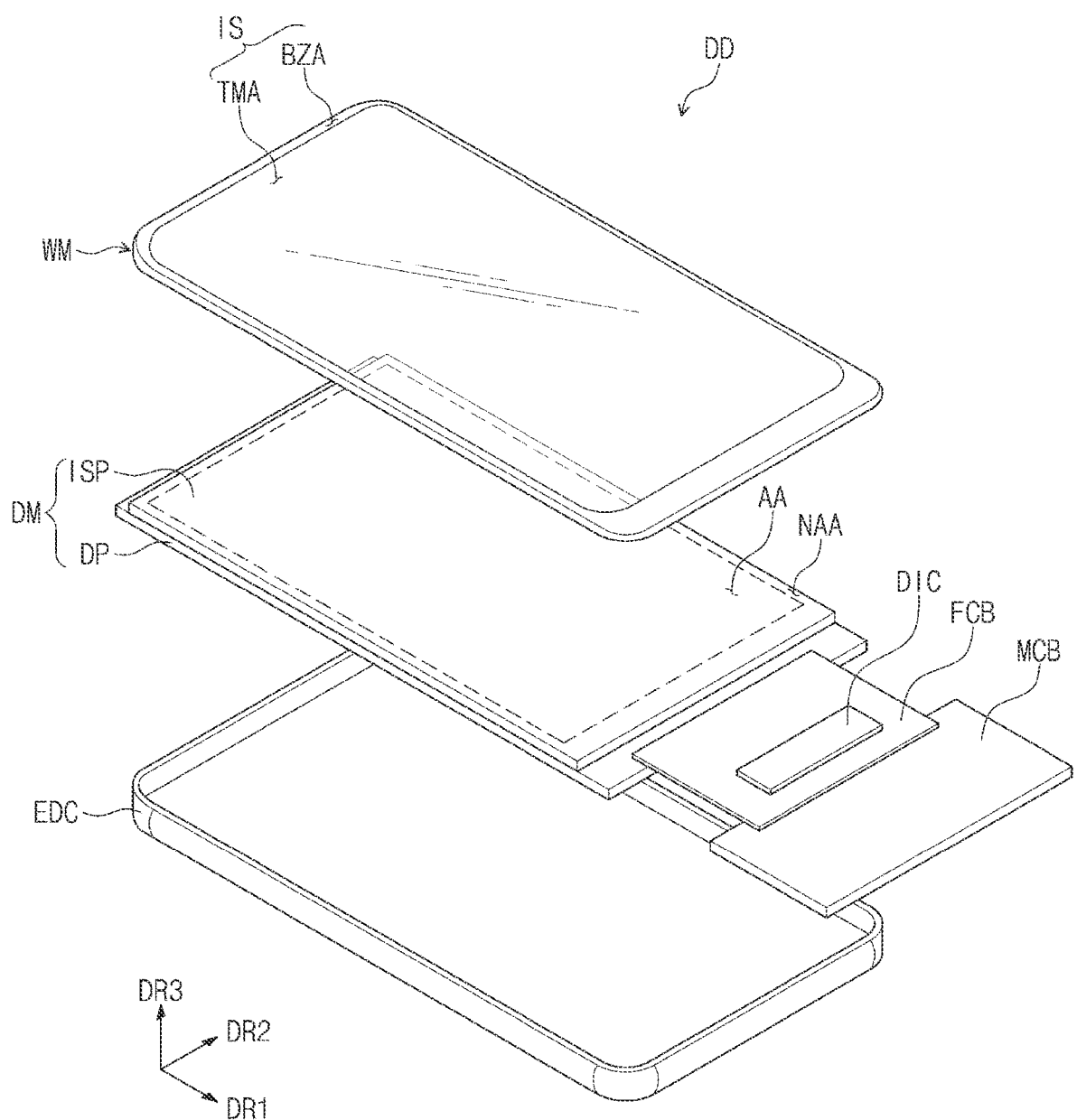
FIG. 2 is a schematic exploded perspective view illustrating a display device, according to an embodiment.

FIG. 1 is a schematic perspective view of a display device, according to an embodiment. FIG. 2 is a schematic exploded perspective view of a display device, according to an embodiment.

Referring to FIG. 1, a display device DD may be a device activated according on an electrical signal. FIGS. 1 and 2 illustrate the display device DD as smartphone. However, embodiments are not limited thereto. For example, as well as a large-sized display device, such as a television, a monitor, or the like, the display device DD may include a small and medium-sized display device, such as a tablet PC, a notebook computer, a vehicle navigation system, a game console, or the like. The above examples are provided only as embodiments. For example, the display device DD may be implemented in various forms.

The display device DD may have a long side in a first direction DR1 and a short side in a second direction DR2 crossing the first direction DR1. The display device DD may have a rectangular shape having rounded vertexes. However, the shape of the display device DD is not limited thereto, and various display devices DD having various shapes may be formed. The display device DD may display an image IM, in a third direction DR3, on a display surface IS parallel to the first direction DR1 and the second direction DR2. The display surface IS, on which the image IM is displayed, may correspond to a front surface of the display device DD.

According to an embodiment, a front surface (e.g., top surface) and a rear surface (e.g., a bottom surface) of each of members are defined based on a direction that the image IM is displayed. The front surface and the rear surface are opposite to each other in the third direction DR3, and a normal direction perpendicular to the front surface and the rear surface may parallel to the third direction DR3.

The distance between the front surface and the rear surface in the third direction DR3 may correspond to the thickness of the display device DD in the third direction DR3. For example, the first direction DR1, the second direction DR2, and the third direction DR3 may be relative concepts and may be changed to different directions.

The display device DD may sense an external input TC applied from the outside. The external input TC may include various types of inputs provided from the outside of the display device DD. The external input TC may be any one of various types of external inputs, such as a part of the user's body, light, heat, and pressure, or a combination thereof. Although it is described that the external input TC of a user US is a touch input to the front surface by a hand of the user US by way of example, embodiments are not limited thereto. As described above, the external input TC of the user US may be provided in various types. For example, the display device DD may sense the external input TC of the user US, which is applied to a side surface or a rear surface of the display device DD according to a structure of the display device DD, and embodiments are not limited thereto. The display device DD may sense the position (for example, the information on coordinates) of the external input TC.

According to an embodiment, the external input TC may include an input made by an input device (e.g., a stylus pen, an active pen, a touch pen, an electronic pen, an e-pen, or the like) in addition to a hand of the user US.

The display surface IS of the display device DD may be divided into a transmission area TMA and a bezel area BZA. The transmission area TMA may be an area to display the image IM. A user views the image IM through the transmission area TMA. In an embodiment, the transmission area TMA is illustrated in the shape of a rectangle having rounded vertexes. However, embodiments are not limited thereto. For example, the transmission area TMA may have various shapes, and embodiments are not limited thereto.

The bezel area BZA may be adjacent to the transmission area TMA. The bezel area BZA may have specific color. The bezel area BZA may surround the transmission area TMA. Accordingly, the shape of the transmission area TMA may be substantially defined by the bezel area BZA. However, embodiments are not limited thereto. The bezel area BZA may be disposed adjacent to only one side of the transmission area TMA or may be omitted. According to an embodiment, the display device DD may include various embodiments, and may not be limited to any one embodiment.

As illustrated in FIG. 2, the display device DD may include a window WM, a display module DM, and an external case EDC. The display module DM may include a display panel DP to display an image IM in response to an electrical signal, and an input sensor in the form of an input sensing layer ISP to transmit/receive information on the external input TC.

The window WM may protect a top surface of the display module DM. The window WM may be optically transparent. The window WM may include a transparent material to output the image IM. For example, the window WM may include glass, sapphire, or plastic. Although the window WM is illustrated in a single layer, embodiments are not limited thereto. For example, the window WM may include multiple layers.

For example, the bezel area BZA of the display device DD may be implemented by printing one area of the window WM with a material having a specific color. As an example, the window WM may include a light blocking pattern for defining the bezel area BZA. The light blocking pattern, which has the form of an organic film having a color, may be formed in, for example, a coating manner.

The window WM may be bonded to the display module DM through an adhesive film. According to an embodiment, the adhesive film may include an optically clear adhesive film (OCA). However, the adhesive film is not limited thereto, but may include a typical adhesive agent and adhesion agent. For example, the adhesive film may include an optically clear resin (OCR) or a pressure sensitive adhesive (PSA) film.

An anti-reflective layer may be additionally disposed between the window WM and the display module DM. The anti-reflective layer reduces a reflective index of external light incident from a top of the window WM. According to an embodiment, the anti-reflective layer may include a phase retarder and a polarizer. The phase retarder may be implemented in a film type or a liquid crystal coating type, and may include a $\lambda/2$ phase retarder and/or a $\lambda/4$ retarder. The polarizer may also have a film type or a liquid crystal coating type. The film-type polarizer may include a stretched synthetic resin film, and the liquid crystal coating-type polarizer may include liquid crystals aligned in an array. The phase retarder and the polarizer may be implemented in the form of one polarizing film.

According to an embodiment, the anti-reflective layer may include color filters. The arrangement of the color filters may be determined, based on colors of light generated from pixels included in the display panel DP. The anti-reflective layer may further include a light blocking pattern.

The display module DM may display an image IM in response to an electrical signal, and may transmit/receive information about an external input. The display module DM may be defined by an active area AA and a non-active area NAA. The active area AA may be an area defined to display the image IM of the display panel DP. Also, the active area AA may be defined as an area in which the input sensing layer ISP senses the external input TC. However, embodiments are not limited thereto. For example, in the display panel DP, an area, which the image IM is displayed, the display panel DP may differ from an area in which the input sensing layer ISP senses the external input TC.

The non-active area NAA may be adjacent to the active area AA. For example, the non-active area NAA may surround the active area AA. However, an example of the non-active area NAA is illustrated in FIG. 2, the non-active area NAA may have various forms, and may not be limited to any one embodiment. According to an embodiment, the active area AA of the display module DM may correspond to at least a portion of the transmission area TMA.

According to an embodiment, the display panel DP may include an emissive display panel. For example, the display panel DP may be an organic light emitting display panel, an inorganic light emitting display panel, or a quantum dot light emitting display panel. A light emitting layer of the organic light emitting display layer may include an organic light emitting material. A light emitting layer of the inorganic light emitting display panel may include an inorganic light emitting material. A light emitting layer of the quantum dot light emitting display panel may include a quantum dot and a quantum rod. The following description will be made that the display panel DP includes the organic light emitting display panel, according to an embodiment.

The input sensing layer ISP may be disposed on the display panel DP to sense the external input TC. A configuration and an operation of the input sensing layer ISP will be described with reference to FIGS. 4 and 5.

According to an embodiment, the display device DD may further include a driver chip DIC, a main circuit board MCB, and a flexible circuit film FCB. The main circuit board MCB may be connected to the flexible circuit film FCB and electrically connected to the display panel DP. The flexible circuit film FCB may be connected to the display panel DP to electrically connect the display panel DP to the main circuit board MCB.

The main circuit board MCB may include driver devices. The driver devices may include a circuit part to drive the display panel DP. The driver chip DIC may be mounted on the flexible circuit film FCB. According to an embodiment, although one flexible circuit film FCB is illustrated, embodiments are not limited thereto. For example, flexible circuit films FCB may be formed and connected to the display panel DP. Although FIG. 2 illustrates the structure that the driver chip DIC is mounted on the flexible circuit film FCB, embodiments are not limited thereto. For example, the driver chip DIC may be directly (or indirectly) mounted on the display panel DP. For example, a part, on which the driver chip DIC is mounted, of the display panel DP may be bent and disposed on a rear surface of the display module DM. For example, the driver chip DIC may be directly (or indirectly) mounted on the main circuit board MCB.

The input sensing layer ISP may be electrically connected to the main circuit board MCB through the flexible circuit film FCB. However, embodiments are not limited thereto. For example, the display module DM may additionally include an additional flexible circuit film to electrically connect the input sensing layer ISP to the main circuit board MCB.

The external case EDC may be coupled to the window WM to define the outer appearance of the display device DD. The external case EDC may absorb external shocks or impacts from the outside and may prevent a foreign material/moisture from being infiltrated or transmitted into the display panel DP such that components received in the external case EDC may be protected. For example, the external case EDC may be formed in the form in which receiving members are coupled to each other.

For example, the display device DD may further include an electronic module including various functional modules to operate the display module DM, a power supply module to supply a power necessary for overall operations of the display device DD, a bracket coupled to the external case EDC to divide an inner space of the display device DD.

Figure 3:
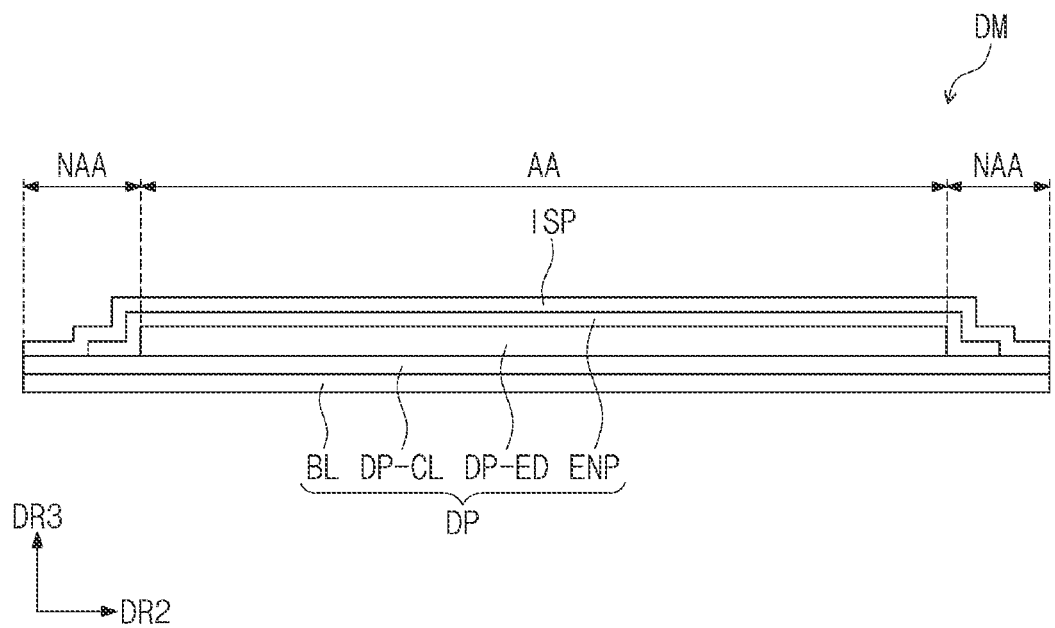
FIG. 3 is a schematic cross-sectional view of a display module illustrated in FIG. 1.

FIG. 3 is a schematic cross-sectional view of a display module illustrated in FIG. 2.

Referring to FIG. 3, the display module DM may include the display panel DP and the input sensing layer ISP. The display panel DP may include a base layer BL, a circuit element layer DP-CL disposed on the base layer BL, a display element layer DP-ED, and an encapsulating layer ENP. For example, the display panel DP may further include functional layers such as an anti-reflective layer and a refractive index control layer.

The base layer BL may include at least one synthetic resin layer. In addition to the synthetic resin layer, the base layer BL may include a glass material layer, a metal material layer, or an organic/inorganic composite material layer. According to an embodiment, the base layer BL may be a flexible layer. The active area AA and the non-active area NAA described with reference to FIG. 2 may be substantially identically defined in the base layer BL.

The circuit element layer DP-CL may be disposed on the base layer BL. The circuit element layer DP-CL may include at least one intermediate insulating layer and a circuit element. The intermediate insulating layer may include at least one intermediate inorganic layer and at least one intermediate organic layer. The circuit element may include signal lines, a driving circuit for pixels, etc.

The display element layer DP-ED may be disposed on the circuit element layer DP-CL. The display element layer DP-ED may include light emitting elements. The light emitting elements may include organic light emitting diodes. The display element layer DP-ED may further include an organic film, such as a pixel defining film.

The encapsulating layer ENP may cover or encapsulate the display element layer DP-ED. The encapsulating layer ENP may include at least one inorganic layer. The encapsulating layer ENP may further include at least one organic layer. The inorganic layer may protect the display element layer DP-ED from moisture/oxygen, and the organic layer may protect the display element layer DP-ED from a foreign material, such as a dust particle. The inorganic layer may include a silicon nitride layer, a silicon oxynitride layer, a silicon oxide layer, a titanium oxide layer, or an aluminum oxide layer. The organic layer may include an acrylic-based organic layer, but embodiments are not limited thereto.

The input sensing layer ISP may be formed on the display panel DP by a subsequent process. According to an embodiment, an adhesive film may be interposed between the input sensing layer ISP and the display panel DP. The input sensing layer ISP may have a multi-layer structure. The input sensing layer ISP may include a single-layer insulating layer or a multi-layer insulating layer. According to an embodiment, when the input sensing layer ISP is directly (or indirectly) on the display panel DP by the subsequent processes, the input sensing layer ISP may be directly (or indirectly) disposed on the encapsulating layer ENP, and the adhesive film may not be interposed between the input sensing layer ISP and the display panel DP. However, according to another embodiment, the adhesive film may be interposed between the input sensing layer ISP and the display panel DP. For example, the input sensing layer ISP may not be formed together with the display panel DP by the subsequent processes. For example, after fabricating the input sensing layer ISP by a process separate from that of the display panel DP, the input sensing layer ISP may be fixed or coupled to a top surface of the display panel DP through the adhesive film.

However, in an embodiment, the display panel DP may further include an encapsulating substrate. The encapsulating substrate may be disposed on the display element layer DP-ED, to face the base layer BL. The encapsulating substrate may include a plastic substrate, a glass substrate, a metal substrate, or an organic/inorganic composite material substrate. A sealant may be interposed between the encapsulating substrate and the base layer BL, and the encapsulating substrate and the base layer BL may be coupled to each other by the sealant. The sealant may include an organic adhesive agent or a frit such as a ceramic adhesive material. The display element layer DP-ED may be sealed by the sealant and the encapsulation substrate.

When the input sensing layer ISP is directly disposed on the display panel DP by the subsequent processes, the input sensing layer ISP may be directly disposed on the encapsulating substrate. However, according to another embodiment, when the adhesive film is interposed between the input sensing layer ISP and the display panel DP, the input sensing layer ISP may be fixed or coupled to the top surface of the encapsulating substrate through the adhesive film.

Figure 4:
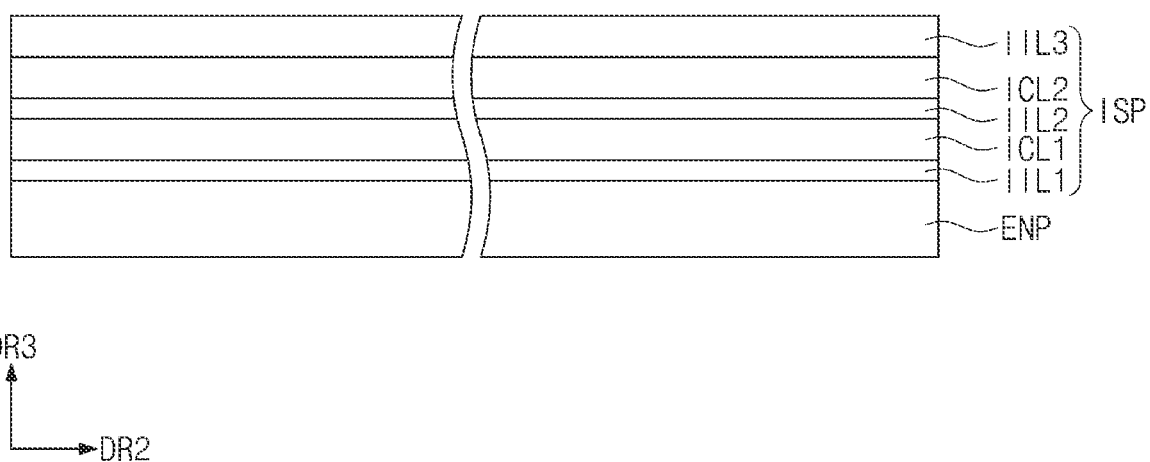
FIG. 4 is a schematic cross-sectional view illustrating a configuration of an input sensing layer, according to an embodiment.
Figure 5:
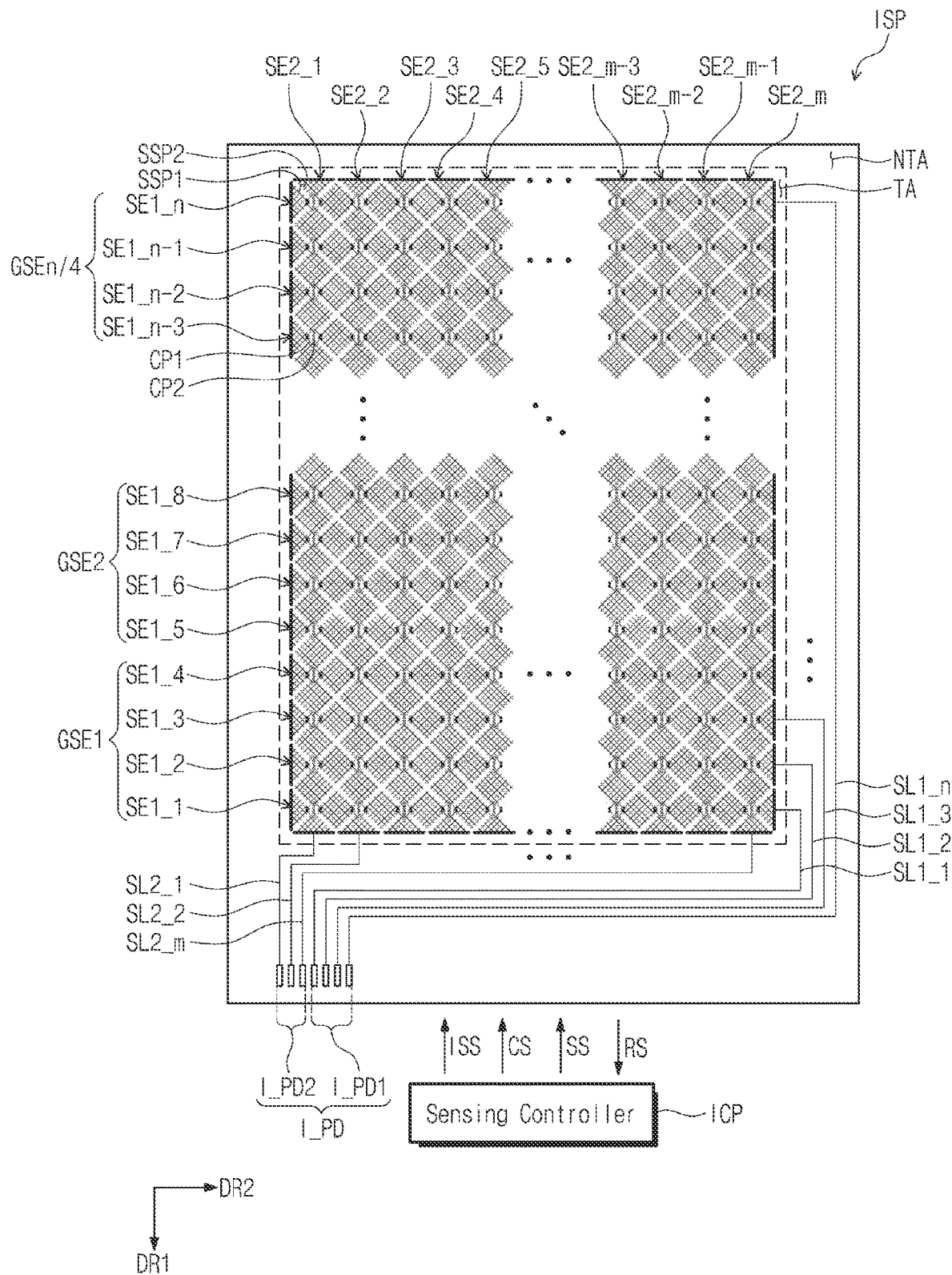
FIG. 5 is a schematic plan view illustrating a configuration of an input sensing layer, according to an embodiment.

FIG. 4 is a schematic cross-sectional view illustrating a configuration of an input sensing layer, according to an embodiment. FIG. 5 is a schematic plan view illustrating a configuration of an input sensing layer, according to an embodiment.

Referring to FIGS. 4 and 5, the input sensing layer ISP may include a first sensing insulating layer TILL a first conductive layer ICL1, a second sensing insulating layer IIL2, a second conductive layer ICL2, and a third sensing insulating layer IIL3. The first sensing insulating layer IIL1 may be directly (or indirectly) disposed on the encapsulating layer ENP. However, according to an embodiment, the first sensing insulating layer IIL1 may be omitted.

Each of the first conductive layer ICL1 and the second conductive layer ICL2 may include conductive patterns. The conductive patterns may include detection electrodes SE1_1 to SE1_n and SE2_1 to SE2_m and signal lines SL1_1 to SL1_n and SL2_1 to SL2_m respectively connected to the detection electrodes SE1_1 to SE1_n and SE2_1 to SE2_m.

Each of the first to third sensing insulating layers IIL1 to IIL3 may include an inorganic material or an organic material. According to an embodiment, the first sensing insulating layer IIL1 and the second sensing insulating layer IIL2 may be inorganic layers. The inorganic layer may include at least one of an aluminum oxide, a titanium oxide, a silicon oxide, a silicon oxynitride, a zirconium oxide, and a hafnium oxide. The thickness of the inorganic layer may be in the range of about 1000 angstroms and about 4000 angstroms.

The third sensing insulating layer IIL3 may be an organic layer. The organic layer may include at least one of acrylate-based resin, methacrylate-based resin, polyisoprene-based resin, vinyl-based resin, epoxy-based resin, urethane-based resin, cellulose-based resin, siloxane-based resin, polyimide-based resin, polyamide-based resin, and perylene-based resin. The third sensing insulating layer IIL3 including an organic material may prevent moisture from being infiltrated or permeated into the first conductive layer ICL1 and the second conductive layer ICL2 from the outside.

According to an embodiment, the input sensing layer ISP may include a sensing area TA and a non-sensing area NTA adjacent to the sensing area TA. For example, the sensing area TA may correspond to at least a portion of the active area AA (see FIG. 2) of the display module DM (see FIG. 2). For example, the sensing area TA may correspond to the active area AA of the display module DM, and the non-sensing area NTA may correspond to the non-active area NAA (see FIG. 2) of the display module DM.

The detection electrodes SE1_1 to SE1_n, and SE2_1 to SE2_m may be disposed in the sensing area TA. The signal lines SL1_1 to SL1_n and SL2_1 to SL2_m may be disposed in a non-sensing area NTA. For example, 'n' and 'm' are natural numbers greater than 1.

According to an embodiment, the detection electrodes SE1_1 to SE1_n and SE2_1 to SE2_m may include scanning electrodes SE1_1 to SE1_n (e.g., transmitting sensor electrodes) and sensing electrodes SE2_1 to SE2_m (e.g., receiving sensor electrodes).

The signal lines SL1_1 to SL1_n and SL2_1 to SL2_m may include scanning signal lines SL1_1 to SL1_n connected to the scanning electrodes SE1_1 to SE1_n and sensing signal lines SL2_1 to SL2_m connected to the sensing electrodes SE2_1 to SE2_m.

The scanning electrodes SE1_1 to SE1_n and the sensing electrodes SE2_1 to SE2_m may cross each other. The scanning electrodes SE1_1 to SE1_n may be arranged in the first direction DR1 and extend in the second direction DR2. The sensing electrodes SE2_1 to SE2_m may be arranged in the second direction DR2 and extend in the first direction DR1.

The input sensing layer ISP described above may obtain coordinate information in a mutual-capacitance manner. Capacitors may be formed between the scanning electrodes SE1_1 to SE1_n and the sensing electrodes SE2_1 to SE2_m. The capacitance of the capacitor may be changed by the external input TC (see FIG. 1). For example, the sensing sensitivity of the input sensing layer ISP may be determined according to the amount of change in capacitance.

The scanning electrodes SE1_1 to SE1_n include first sensor parts SSP1 and first connecting parts CP1 disposed in the sensing area TA. According to an embodiment, each of the first connecting parts CP1 may connect the first sensor parts SSP1 which are adjacent to each other. The first sensor parts SSP1 included in one scanning electrode may be connected to the first connecting parts CP1, respectively, to extend in the second direction DR2. The sensing electrodes SE2_1 to SE2_m may include second sensor parts SSP2 and second connecting parts CP2 disposed in the sensing area TA. According to an embodiment, each of the second connecting parts CP2 may connect second sensor parts SSP2 which are adjacent to each other. The second sensor parts SSP2 included in one sensing electrode may be connected to the second connecting parts CP2 to extend in the first direction DR1.

Each of the scanning electrodes SE1_1 to SE1_n and the sensing electrodes SE2_1 to SE2_m may have a mesh shape. As each of the scanning electrodes SE1_1 to SE1_n and the sensing electrodes SE2_1 to SE2_m may have a mesh shape, a parasitic capacitance with electrodes included in the display panel DP (see FIG. 2) may be reduced or minimized.

The mesh-shaped scanning electrodes SE1_1 to SE1_n and the mesh-shaped sensing electrodes SE2_1 to SE2_m may include, but embodiments are not limited thereto, silver, aluminum, copper, chromium, nickel, or titanium. However, the material constituting the scanning electrodes SE1_1 to SE1_n and the sensing electrodes SE2_1 to SE2_m may be not limited thereto.

Although FIG. 5 illustrates the scanning electrodes SE1_1 to SE1_n and the sensing electrodes SE2_1 to SE2_m, according to an embodiment, the shapes of the scanning electrodes SE1_1 to SE1_n and the sensing electrodes SE2_1 to SE2_m are not limited thereto. According to an embodiment, each of the scanning electrodes SE1_1 to SE1_n or each of the sensing electrodes SE2_1 to SE2_m may have a form (e.g., a bar shape) in which a sensor part and a connecting part are not distinguished from each other. Although it is illustrated that each of the first sensor parts SSP1 or each of the second sensor parts SSP2 has the shape of a rhombus, but embodiments are not limited thereto. For example, the first sensor parts SSP1 and the second sensor parts SSP2 may have different polygonal shapes.

The scanning signal lines SL1_1 to SL1_n and the sensing signal lines SL2_1 to SL2_m may be disposed in the non-sensing area NTA.

According to an embodiment, the scanning electrodes SE1_1 to SE1_n may be grouped into multiple scanning electrode groups GSE1 to GSEn/4 including four scanning electrodes. According to an embodiment, a first scanning electrode group GSE1 may include first to fourth scanning electrodes SE1_1 to SE1_4. A second scanning electrode group GSE2 may include fifth to eight scanning electrodes SE1_5 to SE1_8 of the scanning electrodes SE1_1 to SE1_n. An n-th scanning electrode group GSEn may include (n−3)-th to n-th scanning electrodes SE1_n−3 to SE1_n of the scanning electrodes SE1_1 to SE1_n. However, embodiments are not limited thereto. Each of the scanning electrode groups GSE1 to GSEn/4 may include at least two scanning electrodes of the scanning electrodes SE1_1 to SE1_n. According to an embodiment, the scanning electrodes SE1_1 to SE1_n may not be grouped into the scanning electrode groups GSE1" to GSEn/4.

The input sensing layer ISP may include input pads I_PD extending from one end of each of the sensing signal lines SL1_1 to SL1_n and one end of each of the scanning signal lines SL2_1 to SL2_m, and disposed in the non-active area NAA. The input pads I_PD may be electrically connected to the scanning signal lines SL1_1 to SL1_n and the sensing signal lines SL2_1 to SL2_m, respectively. According to an embodiment, the input pads I_PD may include scanning input pads I_PD1 connected to each of scanning signal lines SL1_1 to SL1_n, and sensing input pads I_PD2, each of which is connected each of the sensing signal lines SL2_1 to SL2_m, respectively.

The display device DD (see FIG. 1) may further include a controller in the form of a sensing controller ICP which controls the driving of the input sensing layer ISP.

As an embodiment, the sensing controller ICP may be electrically connected to the input sensing layer ISP. The sensing controller ICP may be electrically connected to the scanning signal lines SL1_1 to SL1_n and the sensing signal lines SL2_1 to SL2_m through the input pads I_PD.

The sensing controller ICP may transmit input scanning signals ISS to the scanning electrodes SE1_1 to SE1_n through the scanning signal lines SL1_1 to SL1_n. The input scanning signals ISS may be signals to sequentially scan or check the scanning electrodes SE1_1 to SE1_n to sense the external input TC. According to an embodiment, the sensing controller ICP may simultaneously transmit the input scanning signals ISS to the scanning electrodes included in each of the scanning electrode groups GSE1 to GSEn/4. For example, the scanning electrode groups GSE1 to GSEn/4 may be sequentially scanned or checked. However, embodiments are not limited thereto. According to an embodiment, the sensing controller ICP may sequentially scan the scanning electrodes SE1_1 to SE1_n.

The sensing controller ICP may transmit a compensating signal CS and a sensing signal SS to the sensing electrodes SE2_1 to SE2_m. According to an embodiment, the compensating signal CS may be a signal for reducing or minimizing an influence (or interference) exerted on the display panel DP (see FIG. 6) by the input scanning signals ISS applied to the scanning electrodes SE1_1 to SE1_n. The sensing signal SS may be a signal for sensing the change of the input scanning signals ISS by the external input TC. The description of the input scanning signals ISS, the compensating signal CS, and the sensing signal SS, which are applied to the input sensing layer ISP by the sensing controller ICP, will be described below with reference to FIGS. 7A to 12B.

The sensing controller ICP may receive a detection signal RS, in which the change in capacitance between the scanning electrodes SE1_1 to SE1_n and the sensing electrodes SE2_1 to SE2_m by the external input TC is reflected, from the sensing electrodes SE2_1 to SE2_m. The sensing controller ICP may sense the position of the external input TC, based on the detection signal RS.

Figure 6:
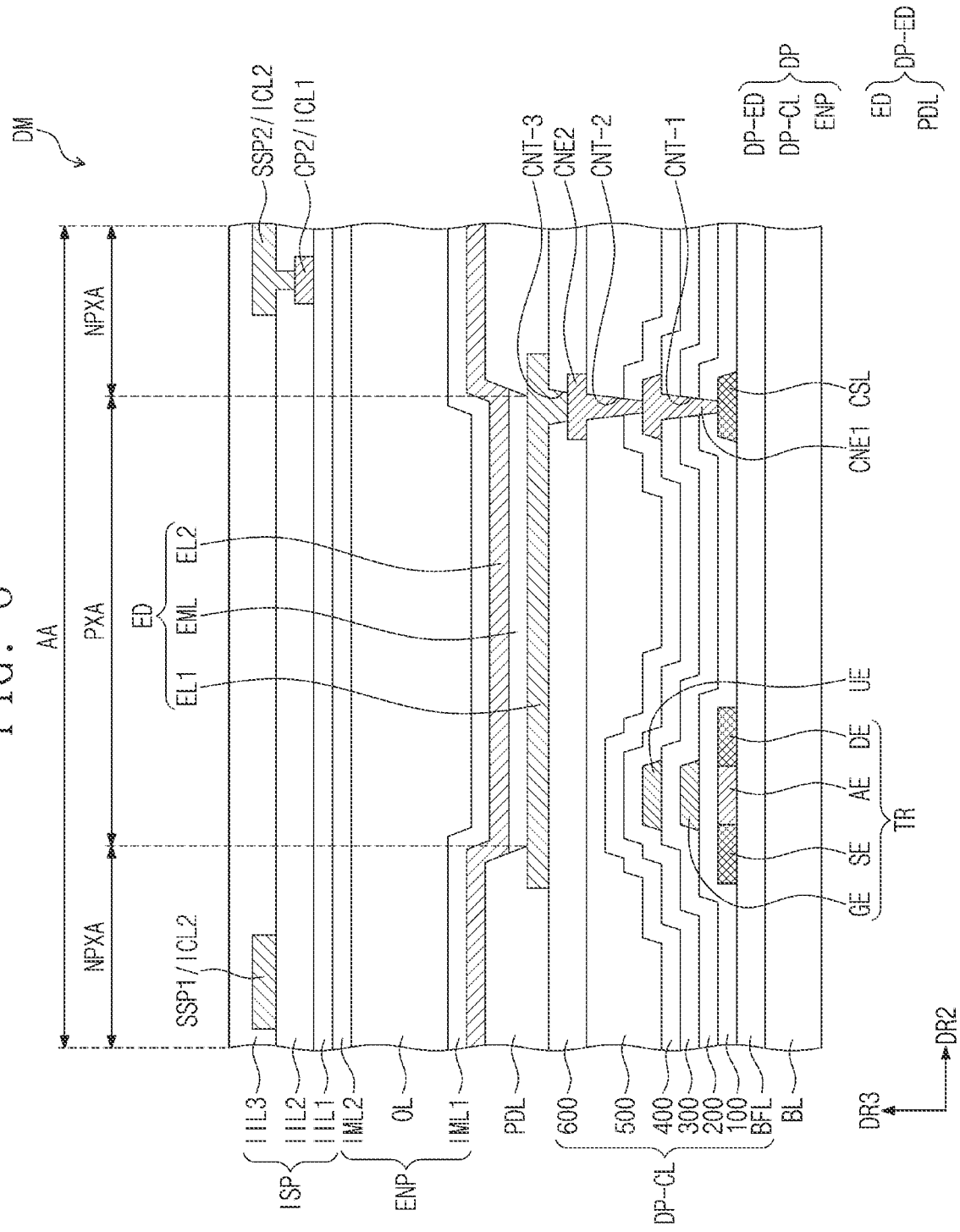
FIG. 6 is a schematic cross-sectional view illustrating a portion of an active area of a display module, according to an embodiment.

FIG. 6 is a schematic cross-sectional view illustrating a portion of an active area of a display module, according to an embodiment.

The display module DM may include the display panel DP and the input sensing layer ISP. The display panel DP may include the base layer BL, the circuit element layer DP-CL, the display element layer DP-ED, and the encapsulating layer ENP.

According to an embodiment, the base layer BL may include a synthetic resin layer. The synthetic resin layer may include a thermosetting resin material. The base layer BL may have a multi-layer structure. For example, the base layer BL may have a three-layer structure of a first synthetic resin layer, an adhesive layer, and a second synthetic resin layer. For example, the synthetic resin layer may be a polyimide-based resin layer, and the material of the synthetic resin layer is not specifically limited. The synthetic resin layer may include at least one of acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin. For example, the base layer BL may include a glass substrate, a metal substrate, or an organic/inorganic composite material substrate.

At least one inorganic layer may be disposed on a top surface of the base layer BL. The inorganic layer may include at least one of an aluminum oxide, a titanium oxide, a silicon oxide, a silicon oxynitride, a zirconium oxide, and a hafnium oxide. The inorganic layer may be formed of multiple layers. The multiple inorganic layers may constitute a barrier layer and/or a buffer layer. According to an embodiment, the circuit element layer DP-CL is illustrated as including a buffer layer BFL.

The circuit element layer DP-CL may include intermediate insulating layers, a semiconductor pattern, a conductive pattern, and a signal line. An intermediate insulating layer, a semiconductor layer, and a conductive layer may be formed by a coating process, ad a depositing process. Thereafter, the intermediate insulating layer, the semiconductor layer, and the conductive layer may be selectively patterned by a photolithography process. The semiconductor pattern, the conductive pattern, and the signal line included in the circuit element layer DP-CL may be formed in such a manner.

The circuit element layer DP-CL may include the buffer layer BFL, a first intermediate insulating layer 100, a second intermediate insulating layer 200, a third intermediate insulating layer 300, a fourth intermediate insulating layer 400, a fifth intermediate insulating layer 500, and a sixth intermediate insulating layer 600.

The buffer layer BFL may improve or increase bonding force between the base layer BL and the semiconductor pattern. The buffer layer BFL may include a silicon oxide layer and a silicon nitride layer, and the silicon oxide layer and the silicon nitride layer may be alternately stacked on each other.

The semiconductor pattern may be disposed on the buffer layer BFL. For example, the semiconductor pattern may include polysilicon. However, embodiments are not limited thereto, and the semiconductor pattern may include amorphous silicon or a metal oxide.

FIG. 6 illustrates some semiconductor patterns, and semiconductor patterns may be additionally disposed in another area of a pixel, when viewed in a plan view. The semiconductor pattern may be arranged in a specific rule or manner, while crossing the pixels. The semiconductor pattern may have a different electrical property based on kinds of dopants, which are doped therein. The semiconductor pattern may include a first semiconductor area having higher conductivity and a second semiconductor area having lower conductivity. The first semiconductor area may be doped with N-type dopants or P-type dopants. A P-type transistor may include a doping area doped with the P-type dopants. The second semiconductor area may be a non-doped area or may be doped with a lighter concentration, as compared to the first semiconductor area.

The conductivity of the first semiconductor area may be greater than that of the second semiconductor area, and may actually serve as an electrode or a signal line. The second semiconductor area actually corresponds to a channel (e.g., active) area AE of a transistor. For example, a portion of the semiconductor pattern may be the channel area AE of a transistor, another portion thereof may be a source area SE or a drain area DE of the transistor, and other portions may be a connection electrode and/or a connection signal line CSL.

As illustrated in FIG. 6, the source area SE, the channel area AE, and the drain area DE of a transistor TR may be formed from the semiconductor pattern. The source area SE and the drain area DE may extend in opposite directions from the channel area AE in the schematic cross-sectional view. A portion of the connection signal line CSL formed from the semiconductor pattern is illustrated in FIG. 6. For example, the connection signal line CSL may be electrically connected with the drain area DE of the transistor TR in a plan view.

The first intermediate insulating layer 100 may be disposed on the buffer layer BFL. The first intermediate insulating layer 100 may overlap pixels in common to cover a semiconductor pattern. The first intermediate insulating layer 100 may be an inorganic layer and/or an organic layer, and may have a single-layer structure or a multi-layer structure. The first intermediate insulating layer 100 may include at least one of an aluminum oxide, a titanium oxide, a silicon oxide, a silicon oxynitride, a zirconium oxide, or a hafnium oxide. According to an embodiment, the first intermediate insulating layer 100 may be a single-layer silicon oxide layer. As described later, the intermediate insulating layers 200, 300, 400, 500, and 600 of the circuit element layer DP-CL may be inorganic and/or organic layers, and may have a single-layer or multi-layer structure. The inorganic layer may include at least one of the materials described above.

A gate GE of the transistor TR may be disposed on the first intermediate insulating layer 100. The gate GE may be a portion of a metal pattern. The gate GE may overlap or face the channel area AE. The gate GE may function as a mask in a doping process of the semiconductor pattern.

The second intermediate insulating layer 200 may be disposed on the first intermediate insulating layer 100 to cover the gate GE. The second intermediate insulating layer 200 may overlap or face the pixels in common. The second intermediate insulating layer 200 may be an inorganic layer and/or an organic layer, and may have a single-layer structure or a multi-layer structure. According to an embodiment, the second intermediate insulating layer 200 may be a single-layer silicon oxide layer.

An upper electrode UE may be disposed on the second intermediate insulating layer 200. The upper electrode UE may overlap or face the gate GE. The upper electrode UE may be a portion of the metal pattern. A portion of the gate GE and the upper electrode UE overlapping or facing the portion of the gate GE may define a capacitor. According to an embodiment, the upper electrode UE may be omitted.

The third intermediate insulating layer 300 may be disposed on the second intermediate insulating layer 200 to cover or overlap the upper electrode UE. The third intermediate insulating layer 300 may overlap or face the pixels in common. The third intermediate insulating layer 300 may be an inorganic layer and/or an organic layer, and may have a single-layer structure or a multi-layer structure. According to an embodiment, the third intermediate insulating layer 300 may be a single-layer silicon oxide layer.

A first connection electrode CNE1 may be disposed on the third intermediate insulating layer 300. The first connection electrode CNE1 may be connected to the connection signal line CSL through a first contact hole CNT-1 formed through the first, second, and third intermediate insulating layers 100, 200, and 300.

The fourth intermediate insulating layer 400 may be disposed on the third intermediate insulating layer 300. The fourth intermediate insulating layer 400 may be a single-layer silicon oxide layer.

The fifth intermediate insulating layer 500 may be disposed on the fourth intermediate insulating layer 400. The fifth intermediate insulating layer 500 may be an organic layer. A second connection electrode CNE2 may be disposed on the fifth intermediate insulating layer 500. The second connection electrode CNE2 may be connected to the first connection electrode CNE1 through a second contact hole CNT-2 formed through the fourth and fifth intermediate insulating layers 400 and 500.

The sixth intermediate insulating layer 600 may be disposed on the fifth intermediate insulating layer 500 to cover the second connection electrode CNE2. The sixth intermediate insulating layer 600 may be an organic layer.

The display element layer DP-ED may be formed on the circuit element layer DP-CL. According to an embodiment, the display element layer DP-ED may include a light emitting element ED and a pixel defining layer PDL.

The light emitting element ED may include a first electrode EL1 disposed on the circuit element layer DP-CL, a light emitting layer EML disposed on the first electrode EL1, and a second electrode EL2 disposed on the light emitting layer EML.

The first electrode EL1 may be disposed on the sixth intermediate insulating layer 600. The first electrode EL1 may be connected to the second connection electrode CNE2 through a third contact hole CNT-3 formed through the sixth intermediate insulating layer 600.

The pixel defining layer PDL may be disposed on the sixth intermediate insulating layer 600 and to cover a portion of the first electrode EL1. A pixel opening part is defined in the pixel defining layer PDL. The pixel opening part may expose at least a portion of the first electrode EL1. According to an embodiment, a light emitting area PXA may correspond to a partial area, which is exposed by the pixel opening part, of the first electrode EL1. A non-light emitting area NPXA may surround the light emitting area PXA, e.g., in a plan view.

The light emitting layer EML may be disposed on the first electrode EL1. The light emitting layer EML may be disposed in an area corresponding to the pixel opening part. For example, the light emitting layer EML may be separately provided or disposed for each of pixels. The light emitting layer EML may include a light emitting material including a fluorescent material or a phosphorescent material. The light emitting material may include an organic emission material or an inorganic emission material, but embodiments are not limited thereto.

The second electrode EL2 may be disposed on the light emitting layer EML. The second electrode EL2 may be integral with each other (or integrally disposed or formed) in pixels in common.

According to an embodiment, the light emitting element ED may further include a hole control layer and an electron control layer. The hole control layer may be interposed between the first electrode EL1 and the light emitting layer EML, and may further include a hole injection layer. The electron control layer may be interposed between the light emitting layer EML and the second electrode EL2, and may further include an electron injection layer.

The encapsulating layer ENP may be disposed on the display element layer DP-ED. The encapsulating layer ENP may be disposed on the second electrode EL2.

The encapsulating layer ENP may be disposed in the pixels in common. According to an embodiment, the encapsulating layer ENP may be directly formed on (or directly contact) the second electrode EL2. According to an embodiment, a capping layer may be further interposed between the encapsulating layer ENP and the second electrode EL2 to cover the second electrode EL2. For example, the encapsulating layer ENP may be directly formed on (or directly contact) the capping layer. In an embodiment, the encapsulating layer ENP may indirectly contact the capping layer.

The encapsulating layer ENP may include a first inorganic layer IML1, an organic layer OL, and a second inorganic layer IML2. The first inorganic layer IML1 and the second inorganic layer IML2 may protect the light emitting element ED from moisture and oxygen, and the organic layer OL may protect the light emitting element ED from a foreign substance such as dust particle. The first inorganic layer IML1 and the second inorganic layer IML2 may include a silicon nitride layer, a silicon oxynitride layer, a silicon oxide layer, a titanium oxide layer, or an aluminum oxide layer. The organic layer OL may include an acrylic-based organic layer, but embodiments are not limited thereto.

The first inorganic layer IML1 may be disposed on the light emitting element ED. The organic layer OL may be disposed on the first inorganic layer IML1.

The second inorganic layer IML2 may be disposed on the organic layer OL.

The input sensing layer ISP may be formed on the display panel DP. The input sensing layer ISP may include the first sensing insulating layer IIL1, the first conductive layer ICL1, the second sensing insulating layer IIL2, the second conductive layer ICL2, and the third sensing insulating layer IIL3.

The first sensing insulating layer IIL1 may be directly (or indirectly) disposed on the encapsulating layer ENP. For example, the first sensing insulating layer IIL1 may directly (or indirectly) make contact with the second inorganic layer IML2. The first sensing insulating layer IIL1 may have a single-layer structure or a multi-layer structure.

The first conductive layer ICL1 may be disposed on the first sensing insulating layer IIL1. The second sensing insulating layer IIL2 may be disposed on the first conductive layer ICL1. The second sensing insulating layer IIL2 may be an inorganic layer and/or an organic layer, and may have a single-layer structure or a multi-layer structure.

The second conductive layer ICL2 may be disposed on the second sensing insulating layer IIL2. Each of the first conductive layer ICL1 and the second conductive layer ICL2 may have a single-layer structure or a multi-layer structure stacked in the third direction DR3. The first and second conductive layers ICL1 and ICL2 of a single-layer structure may include a metal layer or a transparent conductive layer.

The first conductive layer ICL1 and the second conductive layer ICL2 may include the first sensor parts SSP1, the second sensor parts SSP2, the first connection parts CP1, and the second connection parts CP2. According to an embodiment, the first conductive layer ICL1 may include second connection parts CP2. The second conductive layer ICL2 may include the first sensor parts SSP1, the second sensor parts SSP2, and the first connection parts CP1 (see FIG. 5). However, the first sensor parts SSP1, the second sensor parts SSP2, and the first connection parts CP1 may be included in the first conductive layer ICL1, and the second connection parts CP2 may be included in the second conductive layer ICL2.

The third sensing insulating layer IIL3 may be disposed on the second conductive layer ICL2. The third sensing insulating layer IIL3 may be an inorganic layer and/or an organic layer, and may have a single-layer structure or a multi-layer structure.

According to an embodiment, the first and second sensor parts SSP1 and SSP2 and the first and second connection parts CP1 and CP2 may be disposed in the non-light emitting area NPXA.

According to an embodiment, capacitors may be formed between the first conductive layer ICL1 and the second conductive layer ICL2 included in the input sensing layer ISP and electrodes included in the display panel DP. A signal, such as a voltage, applied to the electrode layer of the display panel DP may be influenced (or interfered) by the input scanning signals ISS (see FIG. 5) and the compensating signals CS (see FIG. 5) which are applied to the first conductive layer ICL1 and the second conductive layer ICL2 from the sensing controller ICP (see FIG. 5). According to an embodiment, the electrode layer of the display panel DP may include the second electrode EL2. However, embodiments are not limited thereto. For example, the electrode layer may include an electrode (e.g., the first electrode EL1) included in the display element layer DP-ED or electrodes included in the circuit element layer DP-CL, in addition to the second electrode EL2. The influence (or interference) exerted on an electrode layer of the display panel DP by the input scanning signals ISS and the compensating signal CS will be described below with reference to FIGS. 7A to 12B.

Figure 7A:
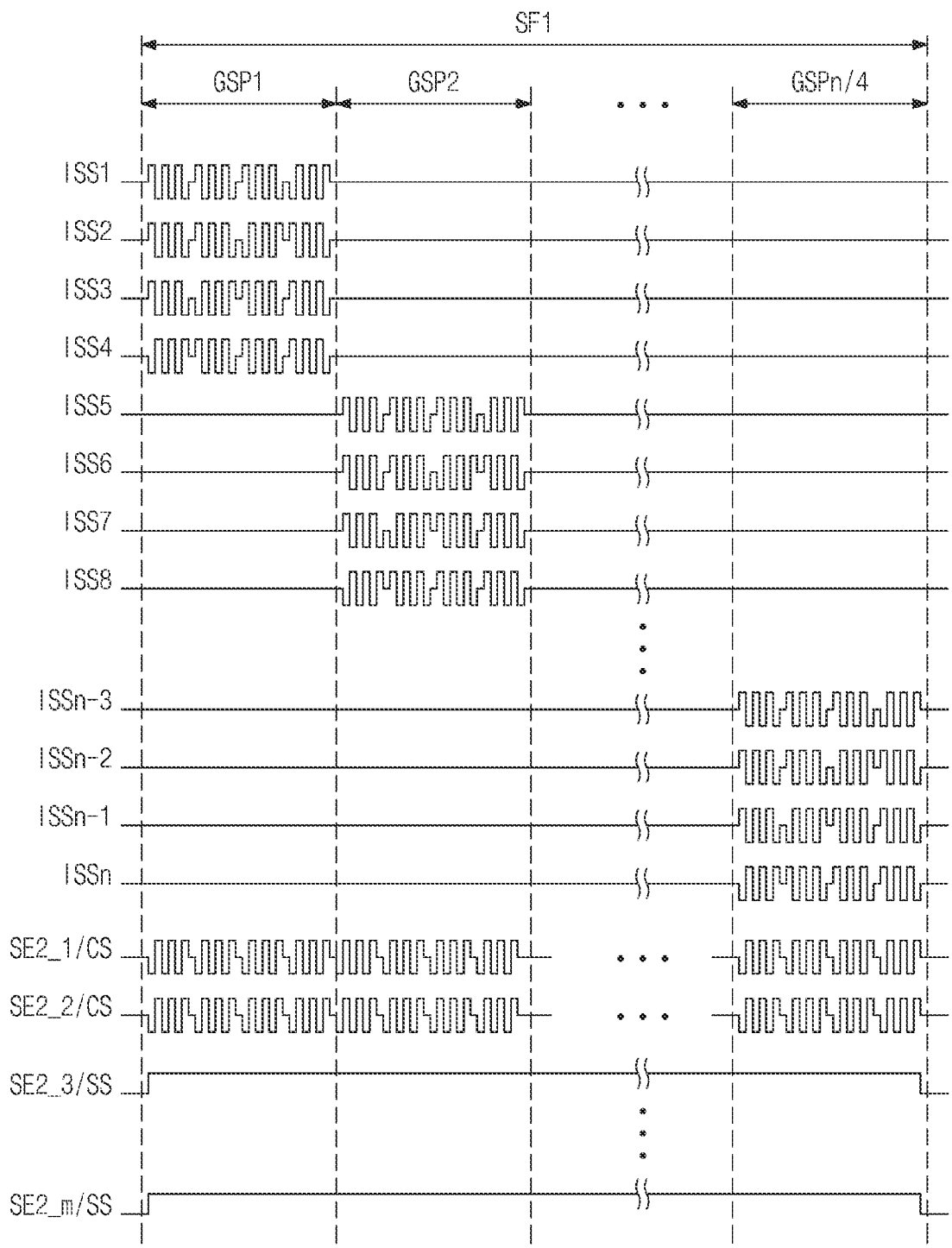
FIGS. 7A, 7B, and 7C are timing diagrams illustrating signals applied to an input sensing layer, according to an embodiment.
Figure 7B:
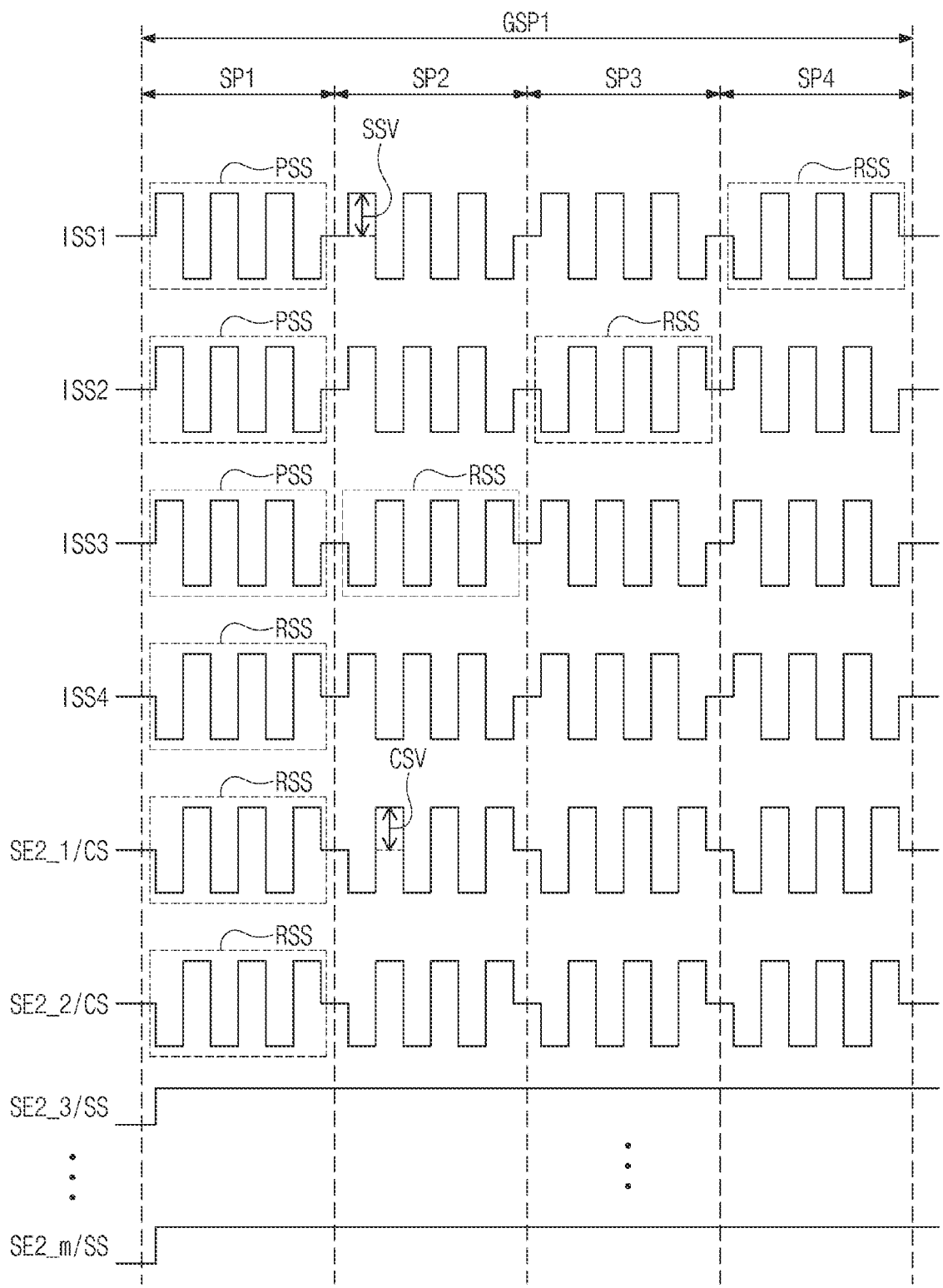
Figure 7C:
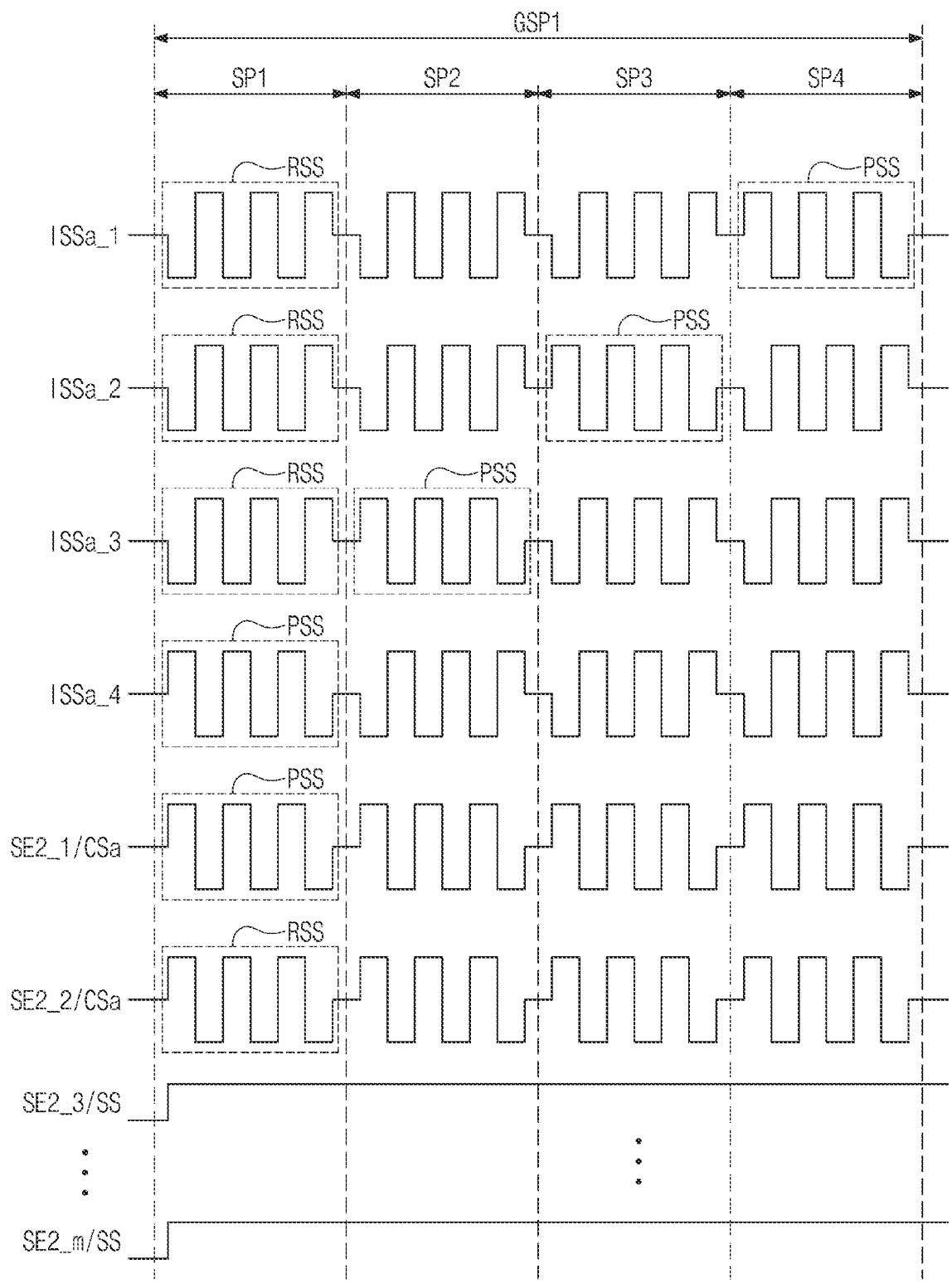

FIGS. 7A, 7B, and 7C are timing diagrams illustrating signals applied to an input sensing layer, according to an embodiment.

Referring to FIGS. 5, 7A, and 7B, the sensing controller ICP (see FIG. 5) senses the external input TC (see FIG. 1) during sensing frames. FIG. 7A illustrates a first sensing frame SF1 of frames.

The sensing controller ICP may transmit input scanning signals ISS1 to ISSn to the scanning electrodes SE1_1 to SE1_n, and transmit a compensating signal CS or a sensing signal SS to the sensing electrodes SE2_1 to SE2_m, during the first sensing frame SF1.

According to an embodiment, the sensing controller ICP may simultaneously transmit the input scanning signals to the scanning electrodes included in each scanning electrode group. For example, when four scanning electrodes are included in each scanning electrode group, the sensing controller ICP may simultaneously apply the input scanning signals to the four scanning electrodes.

According to an embodiment, the first sensing frame SF1 may include multiple group scanning periods GSP1 to GSPn/4. Each of the group scanning periods GSP1 to GSPn/4 may be a duration for which the sensing controller ICP transmits the input scanning signals to each scanning electrode group. According to an embodiment, the sensing controller ICP may transmit first to fourth input scanning signals ISS1 to ISS4 to first to fourth scanning electrodes SE1_1 to SE1_4 included in the first scanning electrode group GSE1 during a first group scanning period GSP1, respectively. The sensing controller ICP may transmit fifth to eighth input scanning signals ISS5 to ISS8 to fifth to eighth scanning electrodes SE1_5 to SE1_8 included in the second scanning electrode group GSE2 during a second group scanning period GSP2, respectively. The sensing controller ICP may simultaneously transmit (n−3)-th to n-th input scanning signals ISSn-3 to ISSn to (n−3)-th to n-th scanning electrodes SE1_n−3 to SE1_n included in the (n/4)-th scanning electrode group GSEn/4, during an (n/4)-th group scanning period GSPn/4.

According to an embodiment, each of the group scanning periods GSP1 to GSPN/4 may include scanning durations. According to an embodiment, the number of scanning durations included in each of the group scanning periods GSP1 to GSPn/4 may be determined to correspond to the number of scanning electrodes included in each of the scanning electrode groups GSE1 to GSEn/4. According to an embodiment, when each of the scanning electrode groups GSE1 to GSEn/4 may include four scanning electrodes, four scanning periods may be included in each of the group scanning periods GSP1 to GSPn/4. The following description will be made with reference to FIGS. 7A to 10B regarding that each of the scanning electrode groups GSE1 to GSEn/4 may include the four scanning electrodes, each of the group scanning periods GSP1 to GSPn/4 may include the four scanning periods.

For example, an input scanning signal (for example, the first input scanning signal ISS1), which is applied, by the sensing controller ICP, to any one scanning electrode (for example, the first scanning electrode SE1) of scanning electrodes included in a relevant one of the scanning electrode groups GSE1 to GSEn/4 during each of the scanning periods SP1 to SP4, may have a phase different from that of input scanning signals (for example, the fourth input scanning signal ISS4) applied to other scanning electrodes (for example, the fourth scanning electrode SE4) of scanning electrodes included in the relevant scanning electrode group of the scanning electrode groups GSE1 to GSEn/4. According to an embodiment, a signal, which has a positive phase PSS as a first phase, of the input scanning signals ISS1 to ISSn is referred to as a positive-phase scanning signal (or a first phase scanning signal), and a signal, which has a reverse phase RSS as a second phase, is referred to as a reverse-phase scanning signal (or a second phase scanning signal). For example, the positive phase PSS (or the first phase) may be reverse to the reverse phase RRS (or the second phase). For example, the phase difference between the positive-phase scanning signal (or the first phase scanning signal) and the reverse-phase scanning signal (or the second phase scanning signal) may be about 180°. The scanning electrodes, which receive the positive-phase scanning signal from the sensing controller ICP during each of the scanning periods SP1 to SP4, are referred to as positive-phase scanning electrodes (or a first phase scanning electrode). The scanning electrodes, which receive the reverse-phase scanning signal from the sensing controller ICP during each of the scanning periods SP1 to SP4, are referred to as reverse-phase scanning electrodes (or a second phase scanning electrode). According to an embodiment, when the number of the positive-phase scanning electrodes in each of the scanning electrode groups GSE1 to GSEn/4 is 'k', the number of the reverse-phase scanning electrodes may be T. For example, 'k' and T may be mutually different natural numbers, which are equal to or greater than 1.

According to an embodiment, the sensing controller ICP may apply the compensating signal CS to each of T number of sensing electrodes of the sensing electrodes SE2_1 to SE2_m during the first sensing frame SF1. The sensing controller ICP may apply the sensing signal SS to remaining sensing electrodes of the sensing electrodes SE2_1 to SE2_m except for the T number of sensing electrodes during the first sensing frame SF1. For example, T may be a natural number, which is equal to or greater than 1.

According to an embodiment, the phase of the compensating signal CS may be determined as being the positive phase PSS and the reverse phase RSS, based on the sizes of the 'k' and the T. For example, 'i' may be determined based on 'k', 'j', the value (or level) CSV of the compensating signal CS, and the values SSV of the input scanning signals ISS1 to ISSn. For example, the value CSV of the compensating signal CS and the values SSV of the input scanning signals ISS1 to ISSn may be, e.g., amplitudes, positive-peak voltages or negative-peak voltages thereof. For example, the value CSV of the compensating signal CS and the input scanning signals ISS1 to ISSn may be half (about 50%) of the voltage differences between the positive-peak voltages and the negative-peak voltages thereof.

According to an embodiment, when 'k' is greater than 'j', the compensating signal CS may have the reverse phase RSS. According to an embodiment, when 'k' is greater than 'j', and when the value CSV of the compensating signal CS is 1/h times the values SSV of the input scanning signals ISS1 to ISSn, 'j', which the number of the sensing electrodes to receive, as the sensing signal, the compensating signal CS having the reverse phase RSS, satisfies the following Equation 1. According to an embodiment, 'h' may be an integer greater than 0. For example, 'h' may be a rational number. For example, the 'h' may be a ratio of the value of the input scanning signals ISS1 to ISSn to the value of the compensating signals CS.

$$i = h \times (k-j)$$ Equation 1

For example, 'j' is the number of the sensing electrodes to receive the compensating signal CS as the sensing scan signal, 'k' is the number of positive-phase scanning electrodes, 'j' is the number of the reverse-phase scanning electrodes, and 'h' is the ratio of the value CSV of the compensating signal CS to the values SSV of the input scanning signals ISS1 to ISSn.

According to an embodiment, when 'k' is greater than 'j', and when the value CSV of the compensating signal CS is substantially equal to the values SSV of the input scanning signals ISS1 to ISSn, 'h' is 1. For example, 'j', which is the number of the sensing electrodes to receive the compensating signal CS having the reverse phase RSS as the sensing signal, is 'k'-'j'.

According to an embodiment, when 'k' is less than 'j', the compensating signal CS may have the positive phase PSS. According to an embodiment, when 'k' is less than 'j', and when the value CSV of the compensating signal CS is 1/h times the value CSV of the compensating signal CS, the number T of the sensing electrodes to receive, as the sensing signal, the compensating signal CS having the positive phase PSS is applied, may satisfy the following Equation 2.

$$i = h \times (j-k)$$ Equation 2

For example, 'j' is the number of sensing electrodes to receive the compensating signal CS as the sensing scan signal, 'k' is the number of positive-phase scanning electrodes, 'j' is the number of reverse-phase scanning electrodes, and 'h' is the ratio of the value CSV of the compensating signal CS to the values SSV of the input scanning signals ISS1 to ISSn.

According to an embodiment, when 'k' is less than 'j', and when the value CSV of the compensating signal CS is substantially equal to the values SSV of the input sensing signal, 'h' is 1. For example, 'j', which is the number of sensing electrodes to receive, as the sensing signal, the compensating signal CS having the positive phase PSS, of the sensing electrodes SE2_1 to SE2_m may be 'k'-'j'.

According to an embodiment, FIG. 7B illustrates the first to fourth input scanning signals ISS1 to ISS4 applied to the first to fourth scanning electrodes SE1_1 to SE1_4 by the sensing controller ICP during the first group scanning period GSP1. FIG. 7B illustrates the compensating signal CS and the sensing signal SS applied to the first to m-th sensing electrodes SE2_1 to SE2_m by the sensing controller ICP during the first group scanning period GSP1. According to an embodiment, FIG. 7B illustrates a timing diagram when 'k' is 3, 'j' is 1, and the value CSV of the compensating signal CS may be substantially equal to the values SSV of the first to fourth input scanning signals ISS1 to ISS4.

For example, referring to FIG. 7B, during the first scanning period SP1, the sensing controller ICP may transmit the first to third input scanning signals ISS1 to ISS3 having positive phases PSS to the first to third scanning electrodes SE1_1 to SE1_3. During the first scanning period SP1, the sensing controller ICP may transmit the fourth input scanning signal ISS4 having the reverse phase RSS to the fourth scanning electrode SE1_4. According to an embodiment, during the first scanning period SP1, each of the first to third input scanning signals ISS1 to ISS3 may have the value substantially equal to that of the fourth input scanning signal ISS4 and a phase reverse to a phase of the fourth input scanning signal ISS4.

According to an embodiment, during the second scanning period SP2, the sensing controller ICP may transmit the first, the second, and the fourth input scanning signals ISS1, ISS2, and ISS4 having the positive phases PSS to the first, the second, and the fourth scanning electrodes SE1_1, SE1_2, and SE1_4. During the second scanning period SP2, the sensing controller ICP may transmit the third input scanning signal ISS3 having the reverse phase RSS to the third scanning electrode SE1_3. According to an embodiment, during the second scanning period SP2, each of the first, the second, and the fourth input scanning signals ISS1, ISS2, and ISS4 may have the value substantially equal to that of the third input scanning signal ISS3 and a phase reverse to a phase of the third input scanning signal ISS3.

According to an embodiment, during the third scanning period SP3, the sensing controller ICP may transmit the first, third, and fourth input scanning signals ISS1, ISS3, and ISS4 having the positive phases PSS to the first, third, and fourth scanning electrodes SE1_1, SE1_3, and SE1_4. During the third scanning period SP3, the sensing controller ICP may transmit the second input scanning signal ISS2 having the reverse phase RSS to the second scanning electrode SE1_2. According to an embodiment, during the third scanning period SP3, each of the first, third, and fourth input scanning signals ISS1, ISS3, and ISS4 may have the value substantially equal to that of the second input scanning signal ISS2 and a phase reverse to a phase of the second input scanning signal ISS2.

According to an embodiment, during the fourth scanning period SP4, the sensing controller ICP may transmit the second, third, and fourth input scanning signals ISS2, ISS3, and ISS4 having the positive phases PSS to the second, third, and fourth scanning electrodes SE1_2, SE1_3, and SE1_4. During the fourth scanning period SP4, the sensing controller ICP may transmit the first input scanning signal ISS1 having the reverse phase RSS to the first scanning electrode SE1_1. According to an embodiment, during the fourth scanning period SP4, each of the second to fourth input scanning signals ISS2, ISS3, and ISS4 may have the value substantially equal to that of the first input scanning signal ISS1 and a phase reverse to a phase of the first input scanning signal ISS1.

As illustrated in FIG. 7B, when 'k' is 3, 'j' is 1, and the first, second, third, and fourth input scanning signals ISS1, ISS2, ISS3, and ISS4 are substantially same values as the compensating signal CS, the number of the sensing electrodes to which the compensating signal CS is applied may be determined as two, based on Equation 1.

According to an embodiment, during the first sensing frame SF1, the sensing controller ICP may provide the compensating signal CS having the reverse phase RSS to the first sensing electrode SE2_1 (see FIG. 5) and the second sensing electrode SE2_2 (see FIG. 5). During the first sensing frame SF1, the sensing controller ICP may provide the sensing signal SS to the third to m-th sensing electrodes SE2_3 to SE2_m (see FIG. 5).

According to an embodiment, as the sensing controller ICP provides the compensating signal CS having the reverse phase RSS to the first sensing electrode SE2_1 and the second sensing electrode SE2_2, the number of signals having the positive phase PSS applied to the input sensing layer ISP may be equal to the number signals having the reverse phase RSS applied to the input sensing layer ISP during the first group scanning period GSP1. For example, during the first scanning period SP1, three signals ISS1, ISS2, and ISS3 may have positive phases PSS, and three signals ISS4, CS, and CS may have the reverse phase RSS. During the second scanning period SP2, three signals ISS1, ISS2, and ISS4 may have positive phases PSS, and three signals ISS3, CS, and CS may have the reverse phase RSS. During the third scanning period SP3, three signals ISS1, ISS3, and ISS4 may have positive phases PSS, and three signals ISS2, CS, and CS may have the reverse phase RSS. For example, during the fourth scanning period SP4, three signals ISS2, ISS3, and ISS4 may have positive phases PSS, and three signals ISS1, CS, and CS have the reverse phase RSS. For example, since the first to fourth input scanning signals ISS1, ISS2, ISS3, and ISS4 have values substantially equal to the value of the compensating signal CS, the influence (or interference) exerted on the display panel DP through the electrode layer of the display panel DP (see FIG. 6) by the signals having the positive phase PSS may be canceled or compensated from the influence (or interference) exerted on the display panel DP by the signals having the reverse phase RSS, during the first group scanning period GSP1. Accordingly, the reliability of the display quality of the image IM (see FIG. 1) displayed on the display panel DP may be maintained regardless of signals applied to the input sensing layer ISP to sense the external input TC (see FIG. 1).

FIG. 7C illustrates a timing diagram when 'k' is less than 'j', and when the first to fourth input scanning signals ISS1, ISS2, ISS3, and ISS4 and a compensating signal Csa are substantially same values as each other. Hereinafter, components and signals, which are the same as the components and signals described with reference to FIGS. 7A and 7B, will be assigned with the same reference numerals and the details thereof will be omitted to avoid redundancy.

As illustrated in FIG. 7C, when 'k' is 1, 'j' is 3, and when the first to fourth input scanning signals ISS1, ISS2, ISS3, and ISS4 are substantially same values as the compensating signal Csa, the number of the sensing electrodes to which the compensating signal Csa is applied may be determined as two, based on Equation 2. Accordingly, the sensing controller ICP may provide the compensating signal Csa having the positive phase PSS to two sensing electrodes.

According to an embodiment, during the first sensing frame SF1, the sensing controller ICP may provide the compensating signal Csa having the positive phase PSS to the first sensing electrode SE2_1 and the second sensing electrode SE2_2. The sensing controller ICP may provide the sensing signal SS to remaining sensing electrodes SE2_3 to SE2_m of the sensing electrodes SE2_1 to SE2_m except for two sensing electrodes SE2_1 and SE2_2. According to an embodiment, the sensing controller ICP may provide the sensing signal SS to remaining sensing electrodes of the third to m-th sensing electrodes SE2_3 to SE2_m except for the first sensing electrode SE2_1 and the second sensing electrode SE2_2. However, the positions of the sensing electrodes which receive the compensating signal Csa applied by the sensing controller ICP may be varied in the unit of one frame. The details thereof will be described below with reference to FIG. 9.

According to an embodiment, as the sensing controller ICP provides the compensating signal Csa having the positive phase PSS to the first sensing electrode SE2_1 and the second sensing electrode SE2_2, the number of signals having the positive phase PSS may be substantially equal to the number of signals having the reverse phase RSS, during the first group scanning period GSP1. For example, during the first scanning period SP1, three signals ISSa_1, ISSa_2, and ISSa_3 have reverse phases RSS, and three signals ISSa_4, Csa, and Csa have the positive phase PSS. For example, during the second scanning period SP2, three signals ISSa_1, ISSa_2, and ISSa_4 have reverse phases RSS, and three signals ISSa_3, Csa, and Csa have the positive phase PSS. For example, during the third scanning period SP3, three signals ISSa_1, ISSa_3, and ISSa_4 have reverse phases RSS, and three signals ISSa_2, PS1, and PS2 have the positive phase PSS. For example, during the fourth scanning period SP4, three signals ISSa_2, ISSa_3, and ISSa_4 have reverse phases RSS, and three signals ISSa_1, Csa, and Csa have the positive phase PSS. For example, since the first to fourth input scanning signals ISSa_1, ISSa_2, ISSa_3, and ISSa_4 have values substantially equal to the value of the compensating signal Csa, the influence (or interference) exerted on the display panel DP through the electrode layer of the display panel DP (see FIG. 6) by the signals having the positive phase PSS may be canceled or compensated by the influence (or interference) exerted on the display panel DP by the signals having the reverse phase RSS, during the first group scanning period GSP1.

Figure 8A:
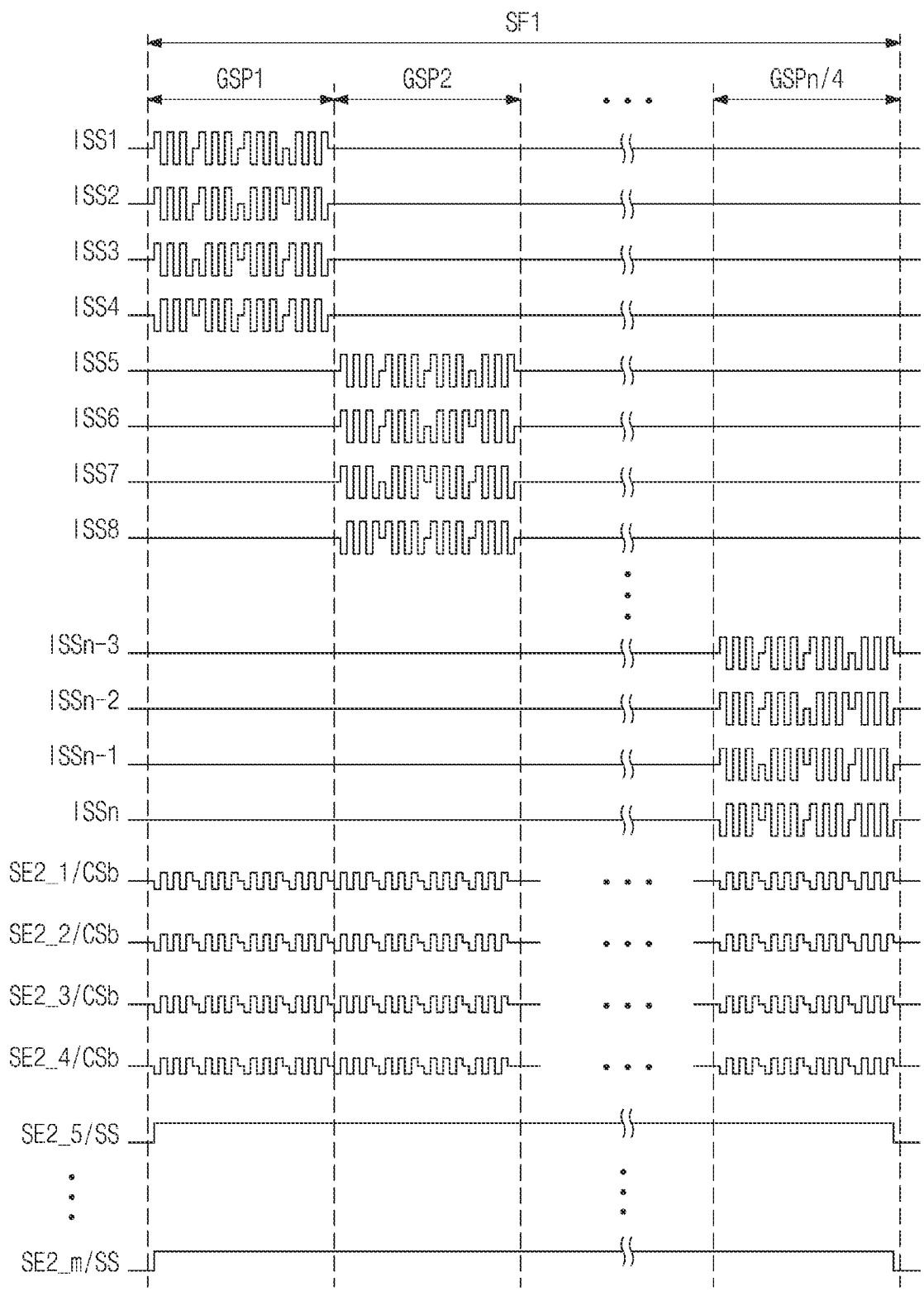
FIGS. 8A and 8B are timing diagrams illustrating the relationship between the value of a compensating signal and the number of sensing electrodes to receive a compensating signal, according to an embodiment.
Figure 8B:
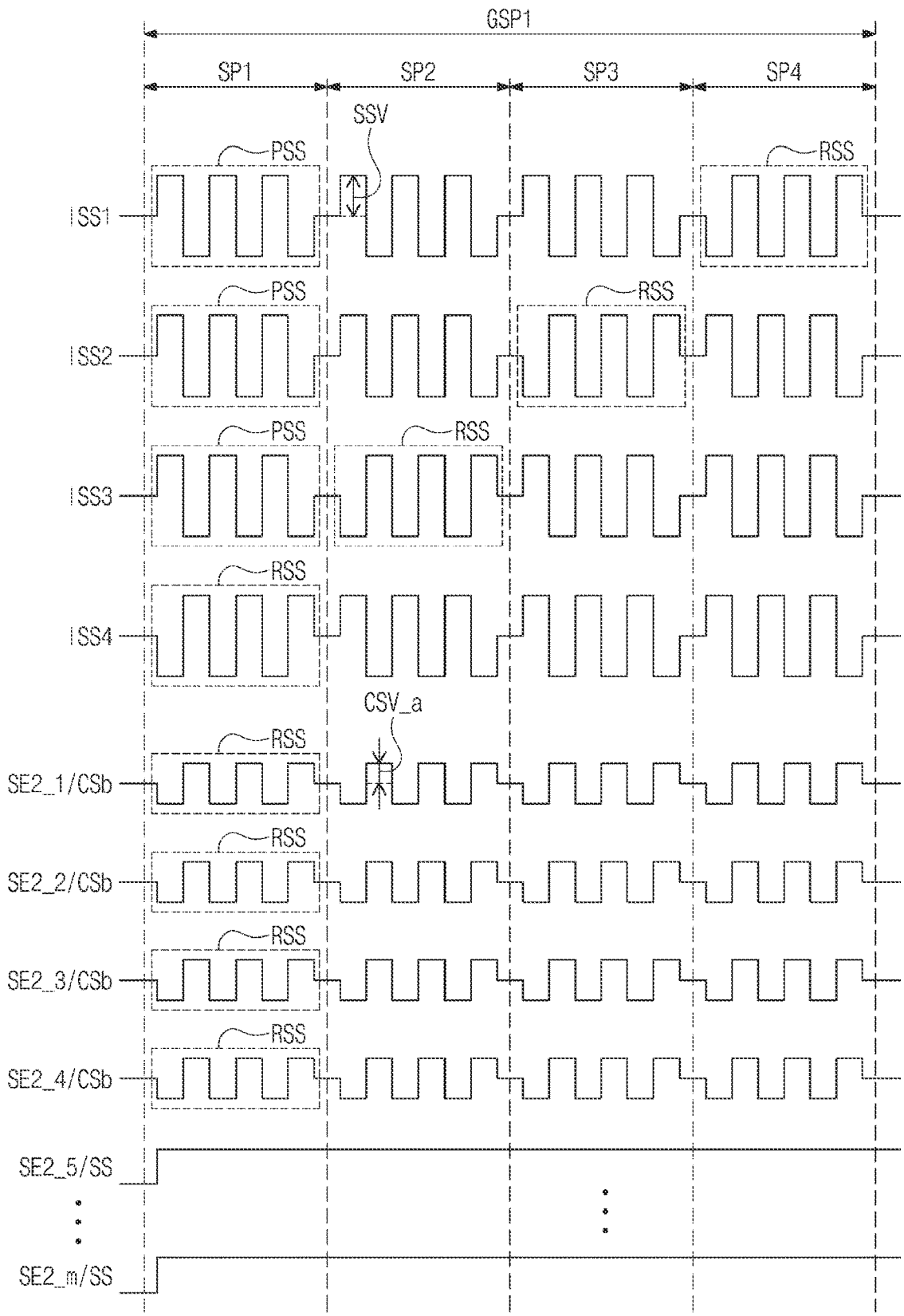

FIGS. 8A and 8B are timing diagrams illustrating the relationship between the value of a compensating signal and the number of sensing electrodes to receive the compensating signal, according to an embodiment.

FIGS. 8A and 8B illustrate timing diagrams when 'k' is 3, 'j' is 1, a value CSV_a of a compensating signal CSb may be less than the values SSV of the input scanning signals ISS1 to ISSn. Hereinafter, components and signals, which are the same as the components and signals described with reference to FIGS. 7A and 7B, will be assigned with the same reference numerals and the details thereof will be omitted to avoid redundancy.

Referring to FIGS. 8A and 8B, 'k' is 3, 'j' is 1, and the value CSV_a of the compensating signal CSb may be 'h' times less than the values SSV of the first to fourth input scanning signals ISS1, ISS2, ISS3, and ISS4. Accordingly, the number of the sensing electrodes to which the compensating signal CSb is applied may be increased by 'h' times, based on Equation 1. According to an embodiment, when the value CSV_a of the compensating signal CSb is reduced to about half (e.g., about 50%) of the values SSV of the first to fourth input scanning signals ISS1, ISS2, ISS3, and ISS4, the number of the sensing electrodes to which the compensating signal CSb is applied may be determined as four.

According to an embodiment, the sensing controller ICP may provide the compensating signal CSb having the reverse phase RSS to the first to fourth sensing electrodes SE2_1, SE2_2, SE2_3, and SE2_4. Three input scanning signals among the first to fourth input scanning signals ISS1, ISS2, ISS3, and ISS4 applied to the input sensing layer ISP (see FIG. 5) may have the positive phases PSS, during the first group scanning period GSP1. One input scanning signal among the first to fourth input scanning signals ISS1, ISS2, ISS3, and ISS may have the reverse phase RSS, during the first group scanning period GSP1. For example, since the value CSV_a of the compensating signal CSb having the reverse phase RSS is half of the values SSV of the first to fourth input scanning signals ISS1, ISS2, ISS3, and ISS4, the influence (or interference) exerted on the display panel DP through the electrode layer of the display panel DP (see FIG. 6) by the signals having the positive phase PSS may be canceled or compensated by the influence (or interference) exerted on the display panel DP by the signals having the reverse phase RSS, during the first group scanning period GSP1.

Figure 9:
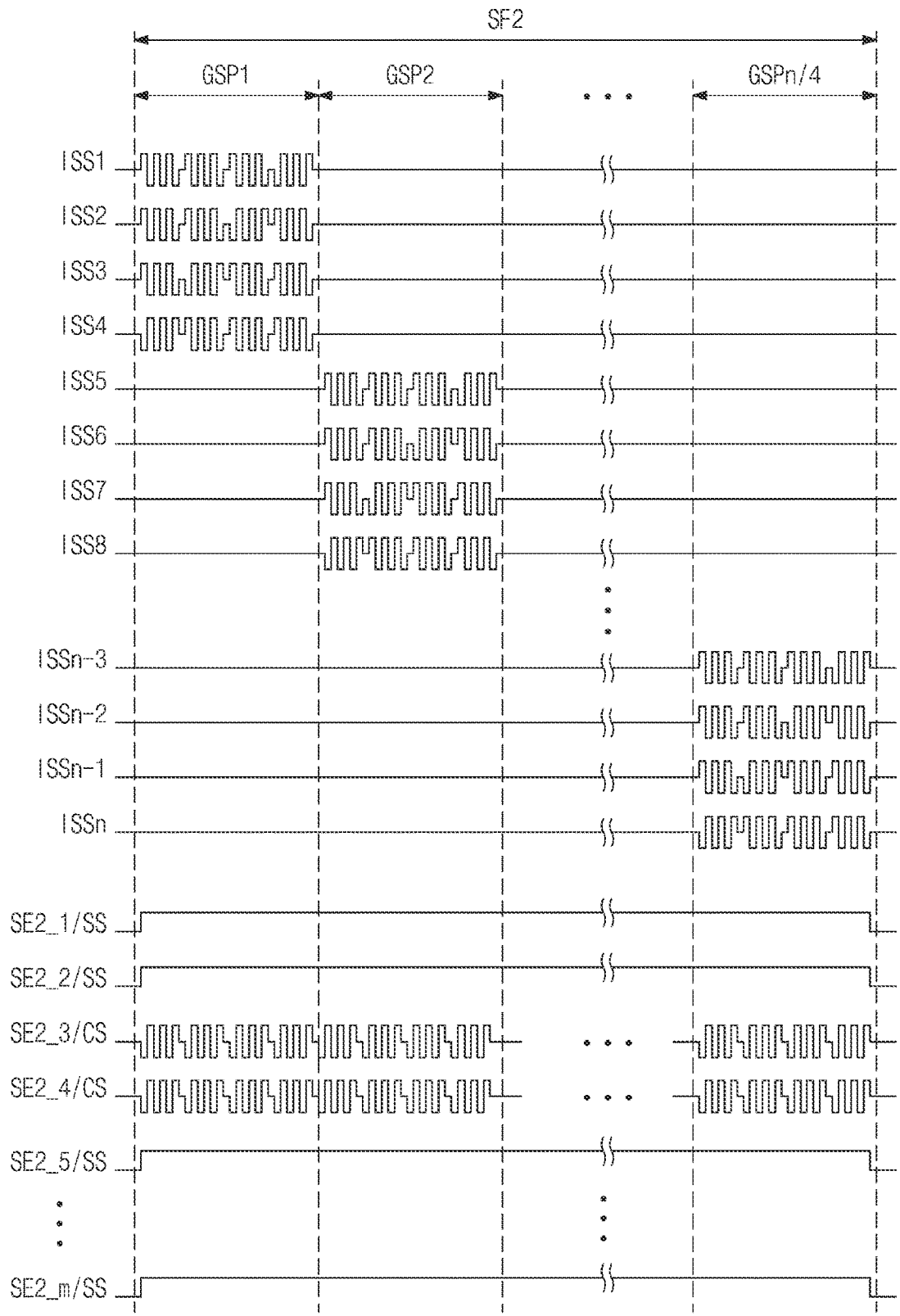
FIG. 9 is a timing diagram illustrating the positions of sensing electrodes to receive a compensating signal, according to an embodiment.

FIG. 9 is a timing diagram illustrating the positions of sensing electrodes to receive a compensating signal, according to an embodiment.

Referring to FIGS. 7A and 9, the sensing controller ICP (see FIG. 5) may change sensing electrodes to receive a compensating signal CS, in the unit of at least one sensing frame.

According to an example, sensing electrodes to receive the compensating signal CS from the sensing controller ICP for the first sensing frame SF1, may differ from sensing electrodes to receive the compensating signal CS from the sensing controller ICP for the second sensing frame SF2. According to an embodiment, the sensing controller ICP may transmit the compensating signal CS to the first and second sensing electrodes SE2_1 and SE2_2 of the sensing electrodes SE2_1 to SE2_m during the first sensing frame SF1. The sensing controller ICP may transmit the compensating signal CS to the third and fourth sensing electrodes SE2_3 and SE2_4 of the sensing electrodes SE2_1 to SE2_m during the second sensing frame SF2. As the sensing electrodes, which are to receive the compensating signal CS from the sensing controller ICP, are varied according to sensing fames, the sensing electrodes to receive the sensing signal SS may be varied according on sensing frames.

When the sensing electrodes receiving the compensating signal CS during sensing frames are not varied, the sensitivity of the input sensing layer ISP may be reduced in an area of the sensing area TA, in which the relevant sensing electrodes receiving the compensating signal CS is disposed, (see FIG. 5). Therefore, according to an embodiment, when different sensing electrodes receive the compensating signal CS during each sensing frame, the influence (or interference) exerted on the display panel DP by the signals applied to the input sensing layer ISP may be minimized with maintaining the reliability of the sensing of the input sensing layer ISP for sensing the external input TC.

Figure 10A:
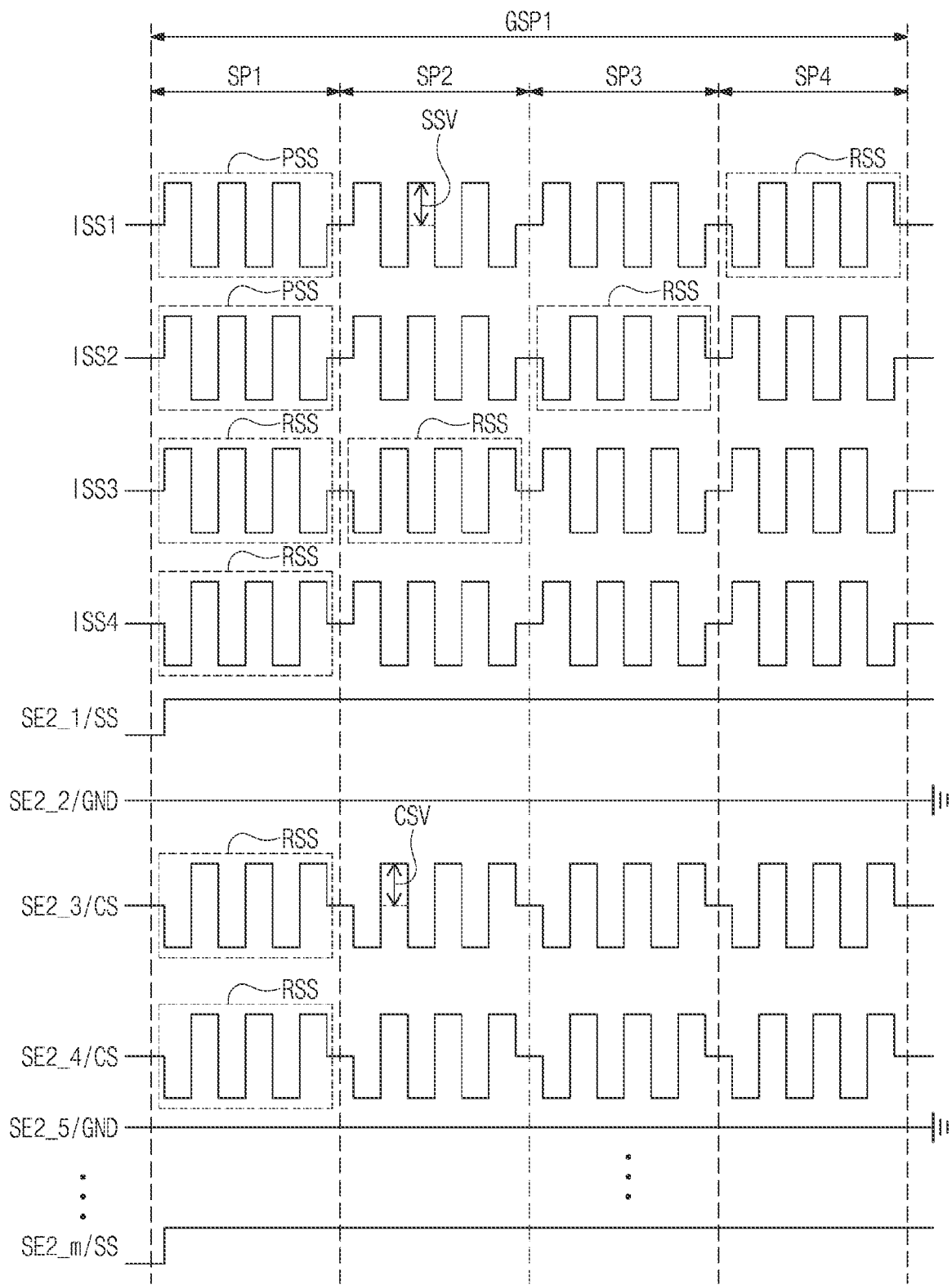
FIGS. 10A and 10B are timing diagrams illustrating sensing electrodes adjacent to sensing electrode to receive a compensating signal, according to an embodiment.
Figure 10B:
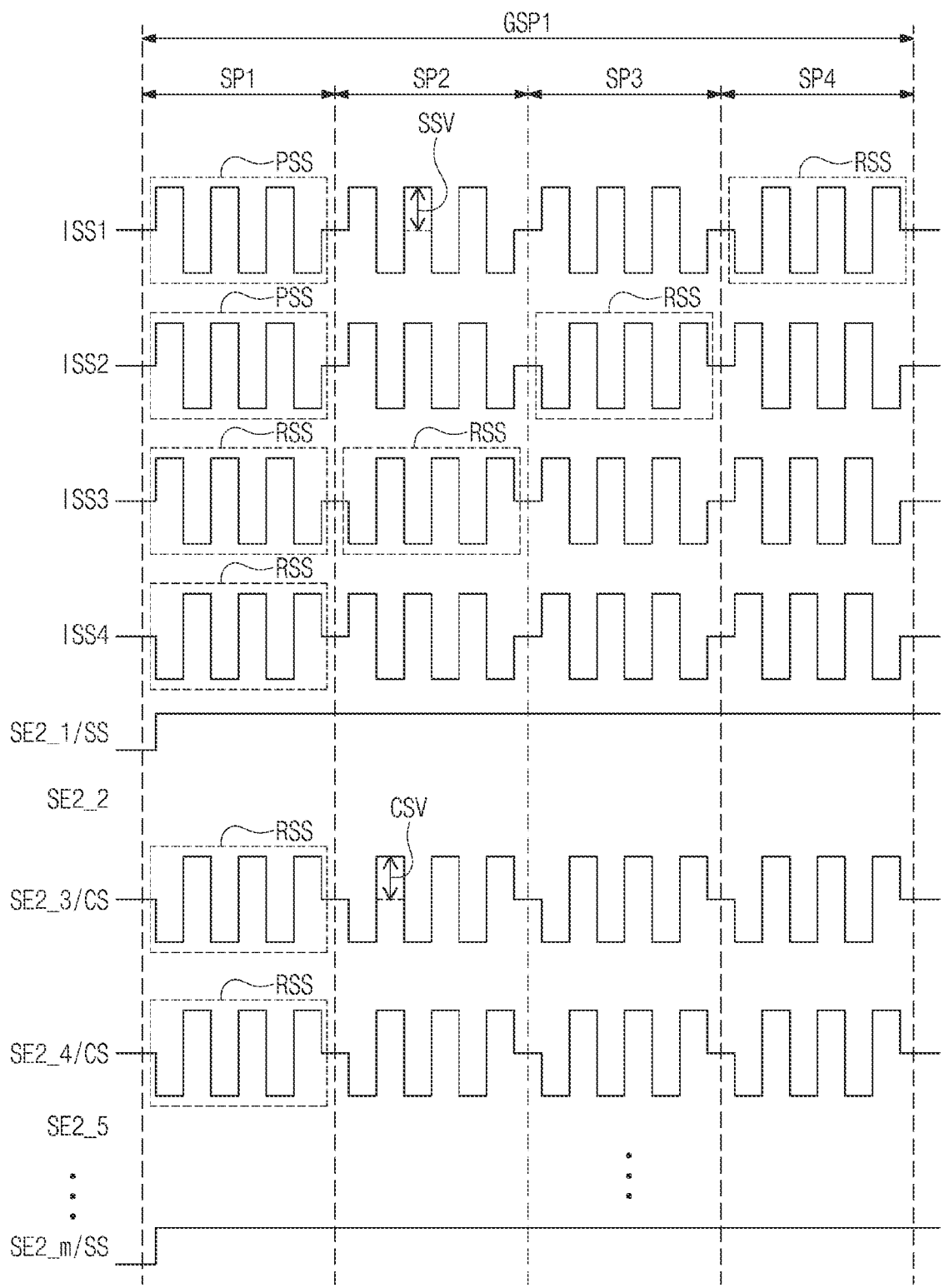

FIGS. 10A and 10B are timing diagrams illustrating sensing electrodes adjacent to sensing electrodes, which receives a compensating signal, according to an embodiment.

FIG. 10A illustrates a timing diagram when 'k' is 3, 'j' is 1, and the value CSV of the compensating signal CS may be substantially equal to the values SSV of the first to fourth input scanning signals ISS1 to ISS4. Hereinafter, components and signals, which are the same as the components and signals described with reference to FIGS. 7A and 7B, will be assigned with the same reference numerals and the details thereof will be omitted to avoid redundancy.

According to an embodiment, the sensing controller ICP may transmit the compensating signal CS to at least one of the sensing electrodes SE2_1 to SE2_m (see FIG. 2). The sensing controller ICP may apply a ground voltage GND to sensing electrodes adjacent to sensing electrodes, which receive the compensating signal CS, of the sensing electrodes SE2_1 to SE2_m. The sensing controller ICP may transmit a sensing signal SS to remaining sensing electrodes of the sensing electrodes SE2_1 to SE2_m except for two sensing electrodes to which the compensating signal CS and the ground voltage GND are applied.

For example, during the first group scanning period GSP1, the sensing controller ICP may transmit the compensating signal CS having the reverse phase RSS to the third and fourth scanning electrodes SE2_3 and SE2_4. The sensing controller ICP may apply the ground voltage GND to the second and fifth sensing electrodes SE2_2 and SE2_5 adjacent to the third and fourth sensing electrodes SE2_3 and SE2_4, respectively, which receive the compensating signal CS. According to an embodiment, the ground voltage GND may be about 0 V. For example, the ground voltage GND may be a reference voltage for the input scanning signals ISS1, ISS2, ISS3, and ISS4, and the compensating signal CS. The sensing controller ICP may apply the sensing signal SS to remaining sensing electrodes except for the second to fifth sensing electrodes SE2_2 to SE2_5. According to an embodiment, the sensing controller ICP may apply the ground voltage GND to the third sensing electrode SE2_3 adjacent to the second sensing electrode SE2_2, when applying the compensating signal CS to the first and second sensing electrodes SE2_1 and SE2_2.

As the ground voltage GND is applied to the sensing electrode adjacent to the sensing electrodes receiving the compensating signal CS, the influence (or interference) exerted on the sensing signal SS by the compensating signal CS may be reduced by the capacitor formed between the sensing electrodes. Accordingly, the sensing reliability of the input sensing layer ISP (see FIG. 5) may be improved or enhanced.

FIG. 10B illustrates a timing diagram when 'k' is 3, 'j' is 1, and the value CSV of the compensating signal CS may be substantially equal to the values SSV of the first to fourth input scanning signals ISS1 to ISS4. Hereinafter, components and signals, which are the same as the components and signals described with reference to FIGS. 7A, 7B, and 10A, will be assigned with the same reference numerals and the details thereof will be omitted to avoid redundancy.

According to an embodiment, the sensing controller ICP may transmit the compensating signal CS to at least one of the sensing electrodes SE2_1 to SE2_m. The sensing controller ICP may maintain sensing electrodes adjacent to sensing electrodes, which receive the compensating signal CS, of the sensing electrodes SE2_1 to SE2_m to have the floating state. The sensing controller ICP may apply the sensing signal SS to remaining sensing electrodes of the sensing electrodes SE2_1 to SE2_m except for the sensing electrodes receiving the compensating signal CS and the sensing electrodes having the floating state.

For example, during the first group scanning period GSP1, the sensing controller ICP may transmit the compensating signal CS having the reverse phase RSS to the third and fourth sensing electrodes SE2_3 and SE2_4. The sensing controller ICP may maintain, in the floating state, the second and fifth sensing electrodes SE2_2 and SE2_5 adjacent to the third and fourth sensing electrodes SE2_3 and SE2_4, respectively, which receive the compensating signal CS. The sensing controller ICP may apply the sensing signal SS to remaining sensing electrodes except for the second to fifth sensing electrodes SE2_2 to SE2_5. According to an embodiment, the sensing controller ICP may maintain the third sensing electrode SE2_3 adjacent to the second sensing electrode SE2_2 to have the floating state, when applying the compensating signal CS to the first and second sensing electrodes SE2_1 and SE2_2.

As the sensing electrode adjacent to the sensing electrodes, which receive the compensating signal CS, is maintained in the floating state, the influence (or interference) exerted on the sensing signal SS by the compensating signal CS may be reduced by the capacitor formed between the sensing electrodes. Accordingly, the sensing reliability of the input sensing layer ISP may be improved or enhanced.

Figure 11A:
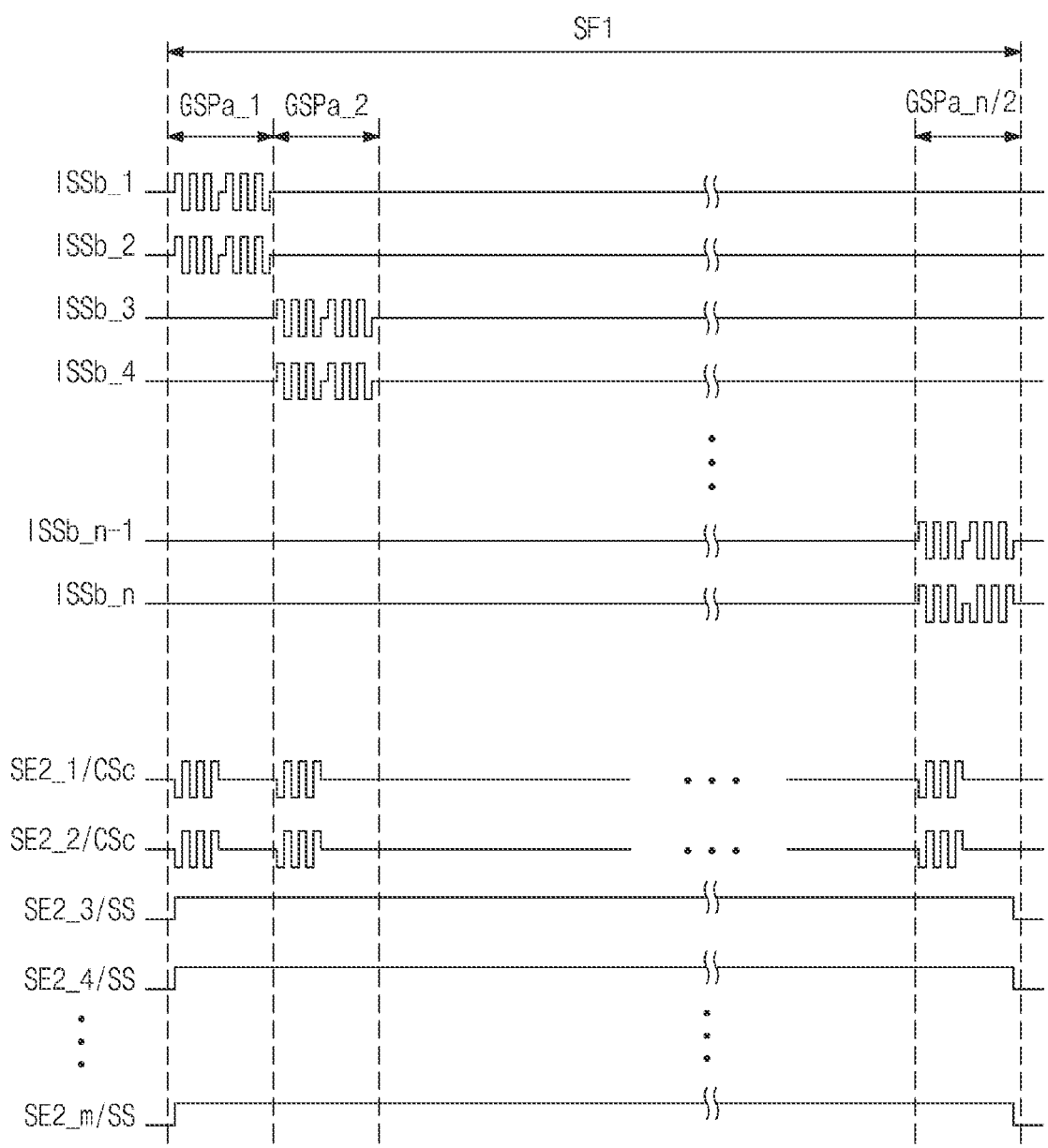
FIGS. 11A and 11B are timing diagrams illustrating signals applied to an input sensing layer, according to an embodiment.
Figure 11B:
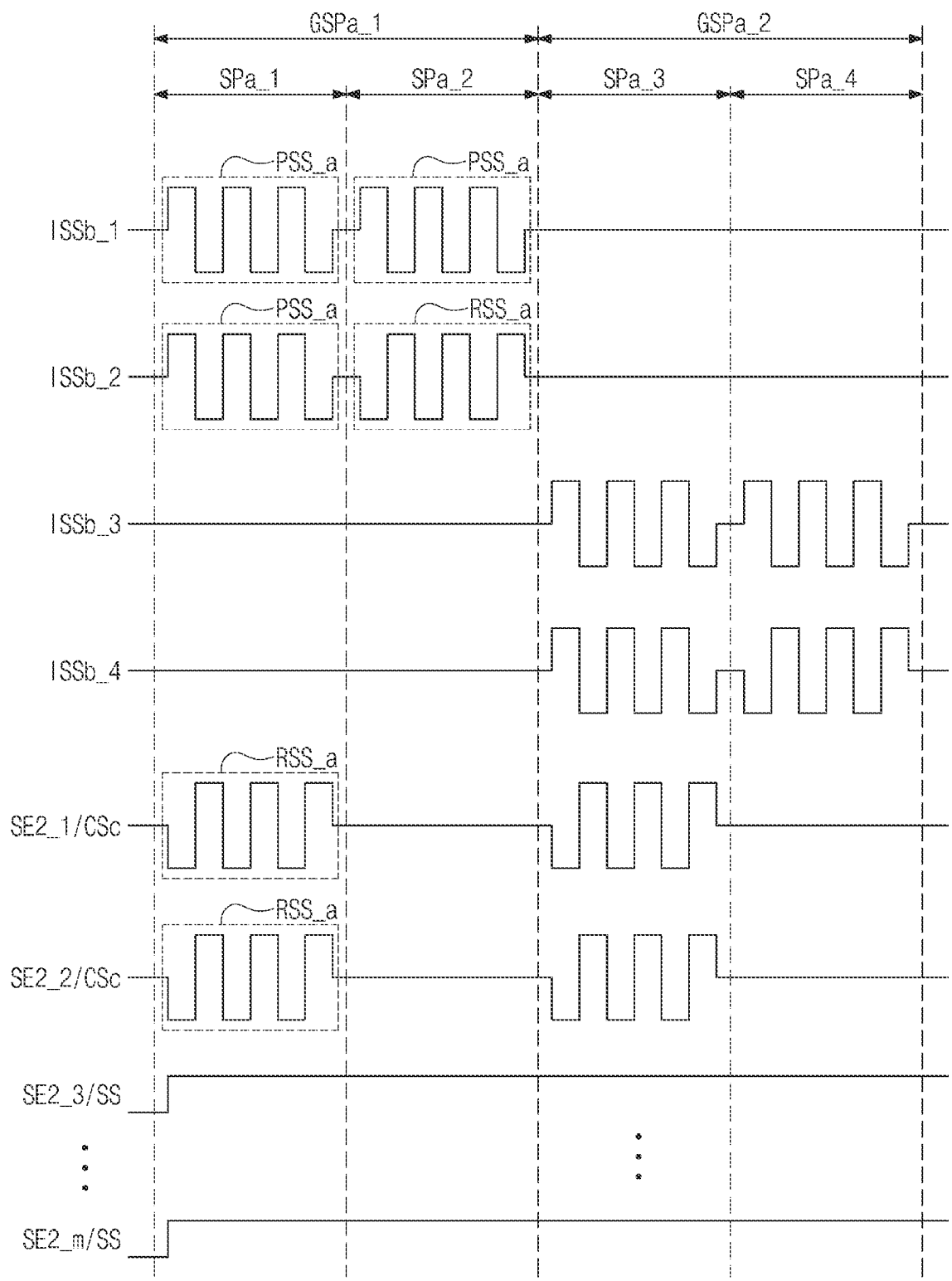

FIGS. 11A and 11B are timing diagrams illustrating signals applied to an input sensing layer, according to an embodiment. Hereinafter, components and signals, which are the same as the components and signals described with reference to FIGS. 7A and 7B, will be assigned with the same reference numerals, and the details thereof will be omitted to avoid redundancy.

Referring to FIG. 11A, the sensing controller ICP (see FIG. 5) may transmit input scanning signals ISSb_1 to ISSb_n to the scanning electrodes SE1_1 to SE1_n (see FIG. 5), and transmit a compensating signal CSc or a sensing signal SS to the sensing electrodes SE2_1 to SE2_m (see FIG. 5), during the first sensing frame SF1. For example, when two scanning electrodes are included in each scanning electrode group, the sensing controller ICP may simultaneously apply the input scanning signals to the two scanning electrodes included in each scanning electrode group.

According to an embodiment, the first sensing frame SF1 may include multiple group scanning periods GSPa_1 to GSPa_n/2. Each of the group scanning periods GSPa_1 to GSPa_n/2 may be a period for which the sensing controller ICP may transmit the input scanning signals to each scanning electrode group. According to an embodiment, the sensing controller ICP may transmit first to second input scanning signals IS Sb_1 to ISSb_2 to first and second scanning electrodes SE1_1 and SE1_2 (see FIG. 5) included in the first scanning electrode group during the first group scanning period GSPa_1, respectively. The sensing controller ICP may transmit the third and fourth signals ISSb_3 to ISSb_4 to third to fourth input scanning electrodes SE1_3 and SE1_4 (see FIG. 5), which are included in the second scanning electrode group, during the second group scanning period GSPa_2, respectively. The sensing controller ICP simultaneously may transmit (n−1)-th to n-th input scanning signals ISSb_n−1 to ISSb_n to (n−1)-th to n-th scanning electrodes SE1_n−1 and SE1_n (see FIG. 5) included in the (n/2)-th scanning electrode group, during the (n/2)-th group scanning period GSPa_n/2.

Referring to FIGS. 5 and 11B, FIG. 11B illustrates the first and second input scanning signals ISSb_1 and ISSb_2 applied to the first scanning electrode SE1_1 and the second scanning electrode SE1_2 by the sensing controller ICP during the first group scanning period GSPa_1. FIG. 11B illustrates the third and fourth input scanning signals ISSb_3 and ISSb_4 applied to the third scanning electrode SE1_3 and the fourth scanning electrode SE1_4 by the sensing controller ICP during the second group scanning period GSPa_2.

FIG. 11B illustrates the compensating signal CSc and the sensing signal SS applied to the first to (m-th) sensing codes SE2_1 to SE2_m by the sensing controller ICP during the first group scanning period. According to an embodiment, FIG. 11B illustrates a timing diagram when 'k' is 3, 'j' is 1, and the value CSV of the compensating signal CSc may be substantially equal to the values SSV of the first to fourth input scanning signals ISSb_1 to ISSb_4.

For example, referring to FIG. 11B, the first group scanning period GSPa_1 may include a first scanning period Spa_1 and a second scanning period Spa_2. The second group scanning period GSPa_2 may include a third scanning period Spa_3 and a fourth scanning period Spa_4.

During the first scanning period Spa_1, the sensing controller ICP may transmit the first and second input scanning signals ISSb_1 and ISSb_2 having a positive phase PSS_a to the first and second scanning electrodes SE1_1 to SE1_2. During the second scanning period Spa_2, the sensing controller ICP may transmit the first input scanning signals ISSb_1 having the positive phase PSS_a to the first scanning electrode SE1_1, and transmit the second input scanning signal ISSb_2 having a reverse phase RSS_a to the second scanning electrode SE1_2. According to an embodiment, during the second scanning period Spa_2, the first and second input scanning signals ISSb_1 and ISSb_2 may have a substantially same value and different phases from each other, which have reverse phases to each other.

As illustrated in the first scanning period Spa_1, when 'k' is '2', 'j' is '0', and when the first and second input scanning signals ISSb_1, and ISSb_2 are substantially same values as the compensating signal CSc, the number of the sensing electrodes to which the compensating signal CSc is applied may be determined as two, based on Equation 1. According to an embodiment, during the first scanning period Spa_1, the sensing controller ICP may provide the compensating signal CSc having the reverse phase RSS_a to the first sensing electrode SE2_1 and the second sensing electrode SE2_2. During the first scanning period Spa_1, the sensing controller ICP may provide the sensing signal SS to the third to m-th sensing electrodes SE2_3 to SE2_m.

As illustrated in the second scanning period Spa_2, when 'k' is 1, 'j' is 1, the number of the sensing electrodes to which the compensating signal CSc is applied may be determined as '0', based on Equation 1. According to an embodiment, during the second sensing period Spa_2, the sensing controller ICP may not apply the compensating signal CSc to the first sensing electrode SE2_1 to the m-th sensing electrode SE2_m. During the second scanning period Spa_2, the sensing controller ICP may provide the sensing signal SS to the first to m-th sensing electrodes SE2_1 to SE2_m.

Accordingly, when the influence (or interference) exerted on the display panel DP (see FIG. 2) by the signals ISSb_1 and ISSb_2 applied from the input sensing layer ISP is not canceled or compensated, which is similar to the first scanning period Spa_1, the compensating signal CSc to cancel or compensate the influence (or interference) is applied to the input sensing layer ISP, such that the reliability of the display quality of the display panel DP is improved or enhanced. For example, when the influence (or interference) exerted on the display panel DP (see FIG. 2) by the signals ISSb_1 and ISSb_2 applied from the input sensing layer ISP is canceled or compensated, which is similar to the second scanning period Spa_2, the sensing signal SS may be applied to the input sensing layer ISP, such that the sensing reliability of the input sensing layer ISP may be improved.

Figure 12A:
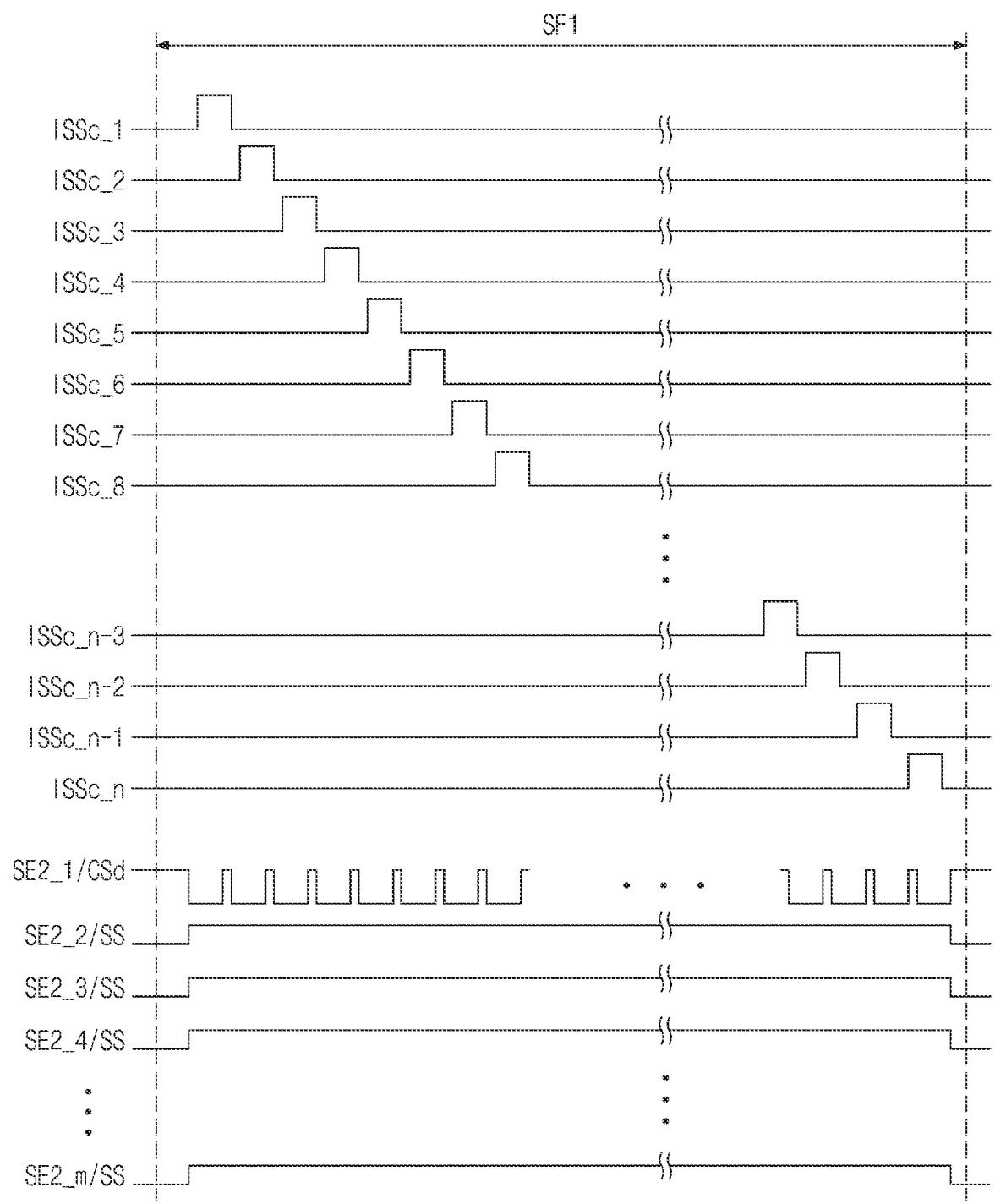
FIGS. 12A and 12B are timing diagrams illustrating signals applied to an input sensing layer, according to an embodiment.
Figure 12B:
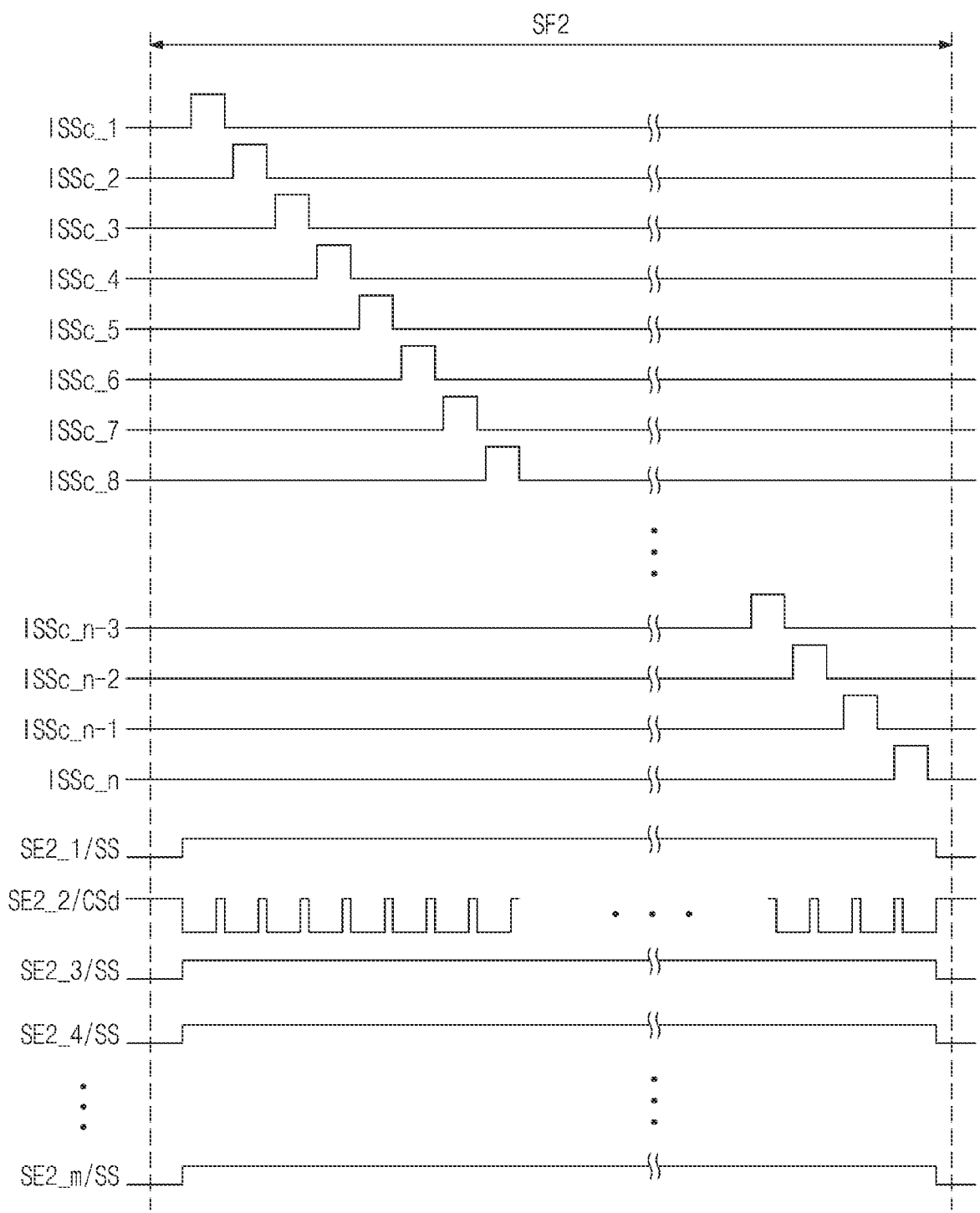

FIGS. 12A and 12B are timing diagrams illustrating signals applied to an input sensing layer, according to an embodiment. Hereinafter, components and signals, which are the same as the components and signals described with reference to FIG. 5, FIG. 7A, and FIG. 9, will be assigned with the same reference numerals and the details thereof will be omitted to avoid redundancy.

Referring to FIG. 5, FIG. 12A, and FIG. 12B, the sensing controller ICP may sequentially apply first to n-th input scanning signals ISSc_1 to ISSc_n to the first to n-th scanning electrodes SE1_1 to SE1_n. The sensing controller ICP may transmit a compensating signal CSd having a reverse phase to the phases of the first to n-th input scanning signals ISSc_1 to ISSc_n to at least one sensing electrode of the first to m-th sensing electrodes SE2_1 to SE2_m. According to an embodiment, the number of the sensing electrodes, to which the compensating signal CSd is applied, may be varied according to the values of the first to the n-th input scanning signals ISSc_1 to ISSc_n. The sensing controller ICP may apply the sensing signal SS to remaining sensing electrodes of the first to the m-th sensing electrodes SE2_1 to SE2_m except for the sensing electrodes receiving the compensating signal CSd.

According to an embodiment, the sensing electrode to receive the compensating signal CSd from the sensing controller ICP during the first sensing frame SF1 may be different from the sensing electrode to receive the compensating signal CSd from the sensing controller ICP during the second sensing frame SF2. According to an embodiment, the sensing controller ICP may apply the compensating signal CSd to the first sensing electrode SE2_1 during the first sensing frame SF1, and may apply the compensating signal CSd to the second sensing electrode SE2_2 during the second sensing frame SF2.

According to an embodiment, the display panel may be prevented from being influenced (or interfered) by the input scanning signal applied to the input sensing layer to sense the external input. For example, the input scanning signal, which is applied to sense the external input, and the compensating signal, which is to minimize the influence (or interference) exerted on the display panel by the input scanning signal, are simultaneously applied to the input sensing layer. The influence (or interference) exerted on the display panel by the input scanning signal is canceled or compensated from the influence (or interference) exerted on the display panel by the compensating signal. Accordingly, the display quality of the image displayed on the display panel may be prevented from being degraded, and the reliability of the display quality of the display panel may be improved.

As described above, embodiments are disclosed in drawings and specifications. Specific terms are used herein, but are only used for the purpose of describing the disclosure, and are not used to limit the meaning or the scope of the disclosure described in claims. Therefore, it will be understood that various modifications and other equivalent embodiments are possible from this point by those skilled in the art. The technical protection scope of the disclosure will be defined by the technical spirit of the appended claims.

While the disclosure has been described with reference to embodiments thereof, it will be apparent to those of ordinary skill in the art that various changes and modifications may be made thereto without departing from the spirit and scope of the disclosure as set forth in the following claims.

What is claimed is:

1. A display device comprising:
a display panel that displays an image;
an input sensor disposed on the display panel, the input sensor sensing an external input; and
a controller that controls driving of the input sensor, wherein
the input sensor includes:

a plurality of scanning electrodes arranged in a first direction and extended in a second direction crossing the first direction; and a plurality of sensing electrodes arranged in the second direction and extended in the first direction, wherein the plurality of sensing electrodes are electrically insulated from and cross the plurality of scanning electrodes, the controller simultaneously transmits input scanning signals to at least two scanning electrodes of the plurality of scanning electrodes during a group scanning period, the group scanning period includes a plurality of scanning periods, and the controller transmits a compensating signal to at least one sensing electrode of the plurality of sensing electrodes during at least one scanning period of the plurality of scanning periods, and the compensating signal has a phase different from a phase of at least one of the input scanning signals applied to at least one of the scanning electrodes.

2. The display device of claim 1, wherein the at least one of the input scanning signals includes:
a first phase scanning signal having a first phase, and
a second phase scanning signal having a second phase reverse to the first phase, the at least two scanning electrodes include:
'k' number of first phase scanning electrodes receiving the first phase scanning signal during the at least one scanning period; and
'j' number of second phase scanning electrodes receiving the second phase scanning signal during the at least one scanning period,
the first phase is reverse to the second phase, and
the 'k' and the 'j' are natural numbers equal to or greater than 1, and are different numbers from each other.

3. The display device of claim 2, wherein the compensating signal has the second phase during the at least one scanning period in case that the 'k' is greater than the 'j'.

4. The display device of claim 3, wherein
the compensating signal is applied to 'i' number of sensing electrodes of the plurality of sensing electrodes, in case that a value of the compensating signal is 1/h times of a value of the first phase scanning signal, and
the 'i' satisfies following Equation 1, $$i = h \times (k-j). \qquad \text{Equation 1}$$

5. The display device of claim 2, wherein the compensating signal has the first phase during the at least one scanning period in case that the 'k' is less than the 'j'.

6. The display device of claim 5, wherein
the compensating signal is applied to 'i' number of sensing electrodes of the plurality of sensing electrodes, in case that a value of the compensating signal is 1/h times of a value of the first phase scanning signal, and
the 'i' satisfies following Equation 2, $$i = h \times (j-k). \qquad \text{Equation 2}$$

7. The display device of claim 1, wherein
the controller simultaneously transmits the input scanning signals to a first scanning electrode and a second scanning electrode during the group scanning period,
the plurality of scanning periods include a first scanning period and a second scanning period, the first scanning electrode and the second scanning electrode receive a first phase scanning signal having a first phase during the first scanning period, the first scanning electrode receives the first phase scanning signal, and the second scanning electrode receives a second phase scanning signal having a second phase during the second scanning period, and the first phase is reverse to the second phase.

8. The display device of claim 7, wherein the controller transmits the compensating signal to the at least one sensing electrode during the first scanning period.

9. The display device of claim 8, wherein the compensating signal has the second phase during the first scanning period.

10. The display device of claim 8, wherein the controller does not transmit the compensating signal to the plurality of sensing electrodes during the second scanning period.

11. The display device of claim 1, wherein the controller transmits a sensing signal of the input scanning signals to remaining sensing electrodes of the plurality of sensing electrodes except for the at least one sensing electrode receiving the compensating signal.

12. The display device of claim 11, wherein the controller:
transmits the compensating signal to the at least one sensing electrode of the plurality of sensing electrodes;
applies a ground voltage to sensing electrodes adjacent to the at least one sensing electrode of the plurality of sensing electrodes; and
transmits the sensing signal to remaining sensing electrodes of the plurality of sensing electrodes except for the at least one sensing electrodes and the sensing electrodes adjacent to the at least one sensing electrode.

13. The display device of claim 11, wherein the controller:
transmits the compensating signal to the at least one sensing electrode of the plurality of sensing electrodes;
maintains, in a floating state, sensing electrodes adjacent to the at least one sensing electrode of the plurality of sensing electrodes; and
transmits the sensing signal to remaining sensing electrodes of the plurality of sensing electrodes except for the at least one sensing electrodes and the sensing electrodes adjacent to the at least one sensing electrode.

14. The display device of claim 1, wherein the controller:
senses the external input during a first sensing frame and a second sensing frame;
transmits the compensating signal to a first sensing electrode of the plurality of sensing electrodes during the first sensing frame; and
transmits the compensating signal to a second sensing electrode of the plurality of sensing electrodes during the second sensing frame.

15. The display device of claim 1, wherein the display panel includes:
a display element layer including a light emitting element; and
an encapsulating layer disposed on the display element layer.

16. The display device of claim 15, wherein the input sensor is disposed directly on the encapsulating layer.

17. The display device of claim 1, further comprising:
an adhesive film disposed on the display panel and the input sensor.

18. A display device comprising:
a display panel that displays an image;
an input sensor disposed on the display panel, the input sensor that detects an external input; and a controller that controls driving of the input sensor, wherein the input sensor includes:
- a plurality of scanning electrodes arranged in a first direction and extended in a second direction crossing the first direction; and
- a plurality of sensing electrodes arranged in the second direction and extended in the first direction, herein the plurality of sensing electrodes are electrically insulated from and cross the plurality of scanning electrodes, and the controller transmits input scanning signals to the plurality of scanning electrodes to sense the external input, and transmits a compensating signal to at least one sensing electrode of the plurality of sensing electrodes, and the compensating signal has a phase different from a phase of at least one of the input scanning signals applied to at least one of the scanning electrodes.

19. The display device of claim 18, wherein the phase of the compensating signal is reverse to each of the phases of the input scanning signals, the input sensor detects the external input during a first sensing frame and a second sensing frame, and the controller transmits the compensating signal to a first sensing electrode of the plurality of sensing electrodes during the first sensing frame, and transmits the compensating signal to a second sensing electrode of the plurality of sensing electrodes during the second sensing frame.

20. The display device of claim 18, wherein the controller transmits a sensing signal of the input scanning signals to remaining sensing electrodes of the plurality of sensing electrodes except for the at least one sensing electrode receiving the compensating signal.

21. The display device of claim 20, wherein the plurality of scanning electrodes include 'x' number of first electrodes, the plurality of sensing electrodes include 'y' number of second electrodes, and the 'x' and the 'y' are natural numbers equal to or greater than 1, and are an equal number or different numbers from each other.

22. The display device of claim 21, wherein the controller sequentially transmits the input scanning signals to the 'x' number of scanning electrodes.

23. The display device of claim 1, wherein the controller applies one of a ground voltage or a floating state to sensing electrodes immediately adjacent to the at least one sensing electrode of the plurality of sensing electrodes.

* * * * *